US011776628B2

(12) United States Patent
Yang et al.

(10) Patent No.: US 11,776,628 B2
(45) Date of Patent: Oct. 3, 2023

(54) SYSTEMS AND METHODS FOR ADJUSTING THRESHOLD VOLTAGE DISTRIBUTION DUE TO SEMI-CIRCLE SGD

(71) Applicant: SanDisk Technologies LLC, Addison, TX (US)

(72) Inventors: Xiang Yang, Santa Clara, CA (US); Kazuki Isozumi, Kuwana (JP); Parth Amin, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 35 days.

(21) Appl. No.: 17/350,770

(22) Filed: Jun. 17, 2021

(65) Prior Publication Data
US 2022/0406378 A1    Dec. 22, 2022

(51) Int. Cl.
| | | |
|---|---|---|
| *G11C 16/04* | (2006.01) | |
| *G11C 16/34* | (2006.01) | |
| *G11C 16/26* | (2006.01) | |
| *G11C 16/10* | (2006.01) | |

(52) U.S. Cl.
CPC .......... *G11C 16/0483* (2013.01); *G11C 16/10* (2013.01); *G11C 16/26* (2013.01); *G11C 16/3459* (2013.01)

(58) Field of Classification Search
CPC ..... G11C 16/0483; G11C 16/10; G11C 16/26; G11C 16/3459
USPC .................................................. 365/185.17
See application file for complete search history.

(56) References Cited

U.S. PATENT DOCUMENTS

| | | | | |
|---|---|---|---|---|
| 8,921,921 | B2* | 12/2014 | Ahn | H01L 27/11582 |
| | | | | 257/329 |
| 9,397,111 | B1* | 7/2016 | Chowdhury | H01L 27/11582 |
| 2015/0194435 | A1* | 7/2015 | Lee | H10B 43/35 |
| | | | | 257/329 |
| 2016/0027514 | A1* | 1/2016 | Sim | G11C 11/5628 |
| | | | | 365/185.17 |
| 2016/0260495 | A1* | 9/2016 | Paudel | G11C 16/3427 |
| 2017/0125117 | A1* | 5/2017 | Tseng | G11C 16/10 |
| 2017/0338243 | A1* | 11/2017 | Sohn | H01L 29/40117 |
| 2018/0075919 | A1* | 3/2018 | Pang | H01L 27/11582 |

* cited by examiner

*Primary Examiner* — Tha-O H Bui
(74) *Attorney, Agent, or Firm* — DICKINSON WRIGHT PLLC; Steven C. Hurles

(57) ABSTRACT

The following disclosure is directed to mitigating issues related to semi-circle drain side select gate (SC-SGD) memory holes in memory structures. When a memory hole is cut, the channel and the charge trap layer of the memory hole cut. Further, the outer dielectric layer (used to shield the channel and the charge trap layer) is cut and partially removed. When the selected SC-SGD is selected for an operation (e.g., programming), the channel and the charge trap layer are exposed to neighboring electrical field from bias voltage applied to an unselected SC-SGD. To prevent or mitigate the effects of this electrical field, a negative bias voltage is applied to the unselected SC-SGD. Additionally, this disclosure is directed to self-compensating techniques for SC-SGD. For example, the memory structure can utilize the neighboring electric field during verify, program, and read operations, whether the neighboring electric field is relatively strong or weak.

12 Claims, 23 Drawing Sheets

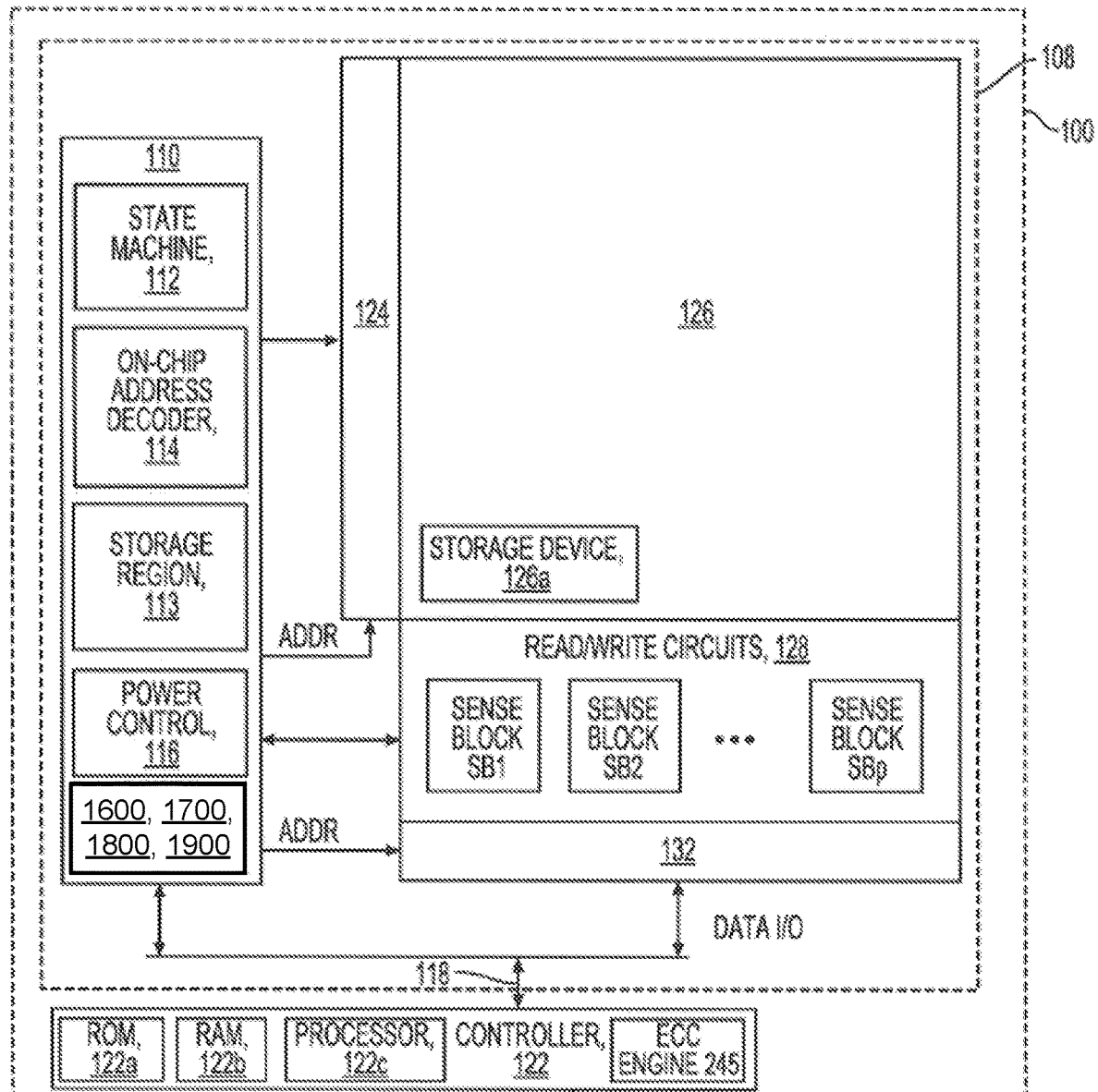
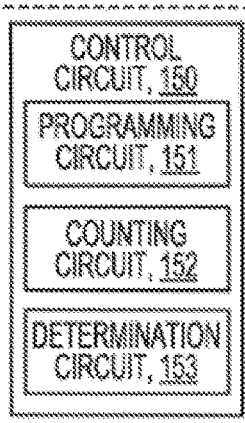
FIG. 1A
FIG. 1B

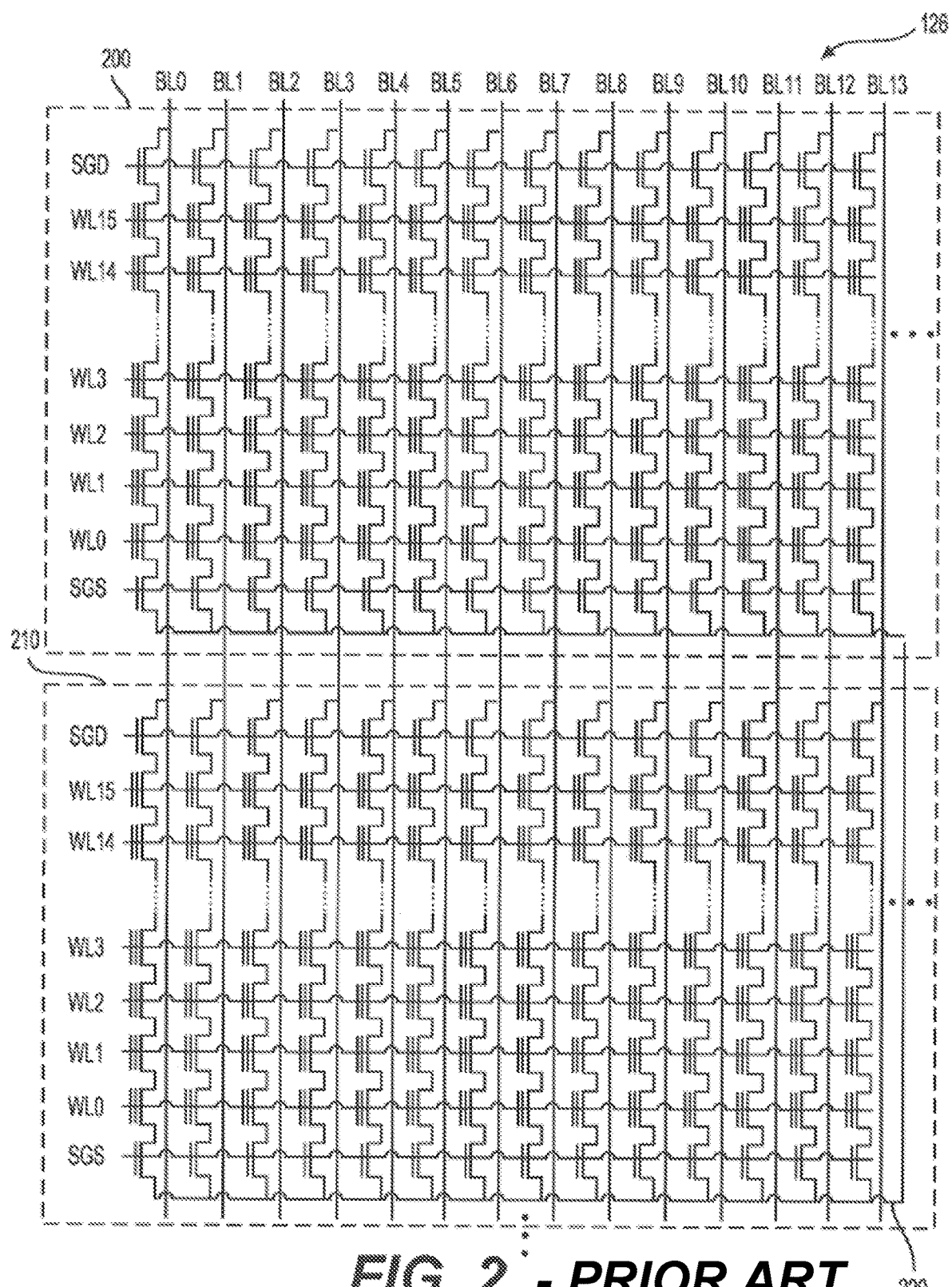
FIG. 2 - PRIOR ART

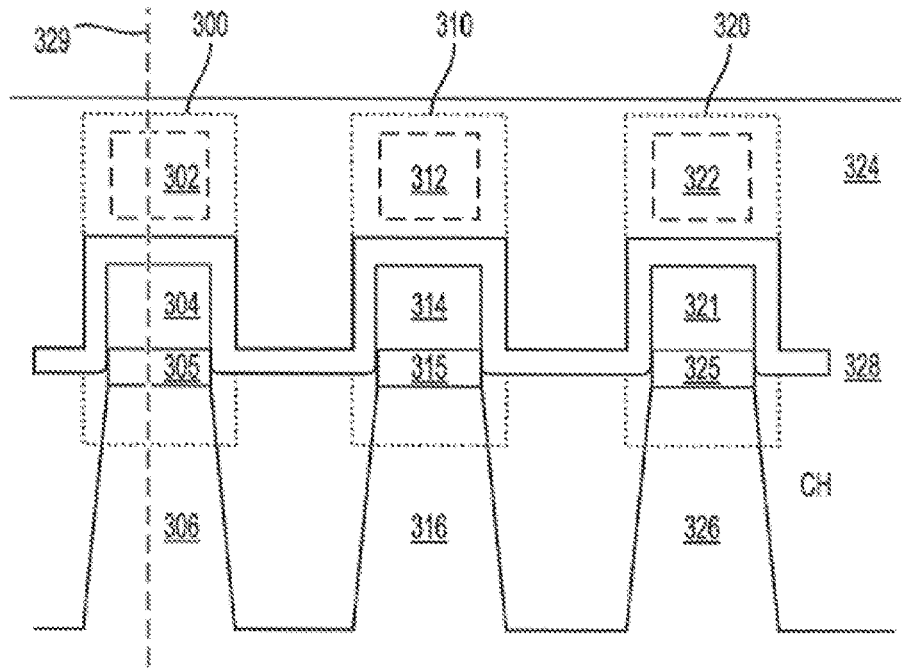
FIG. 3A - PRIOR ART
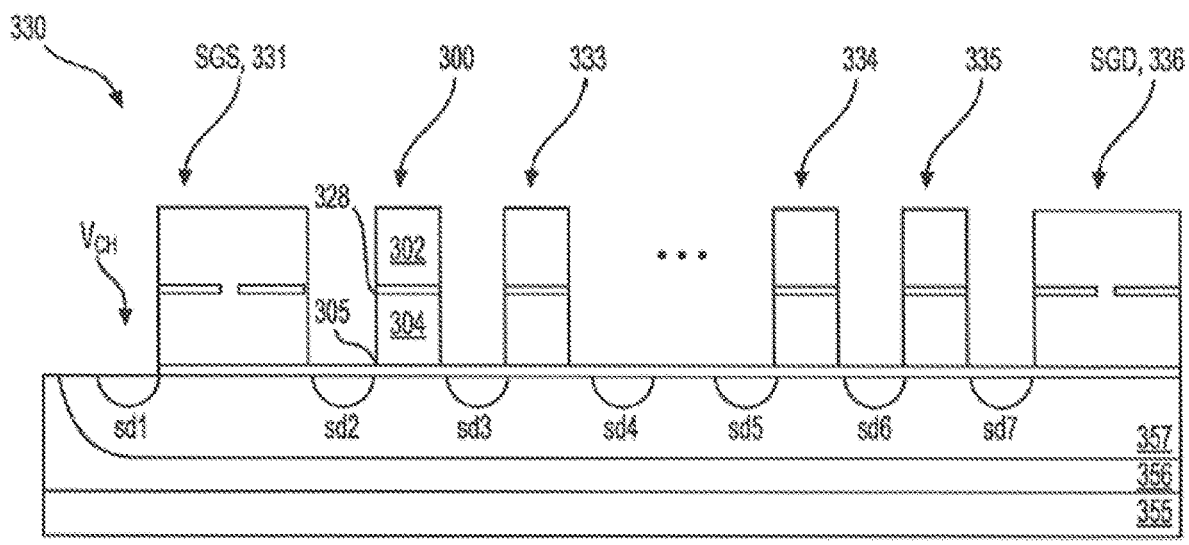
FIG. 3B - PRIOR ART

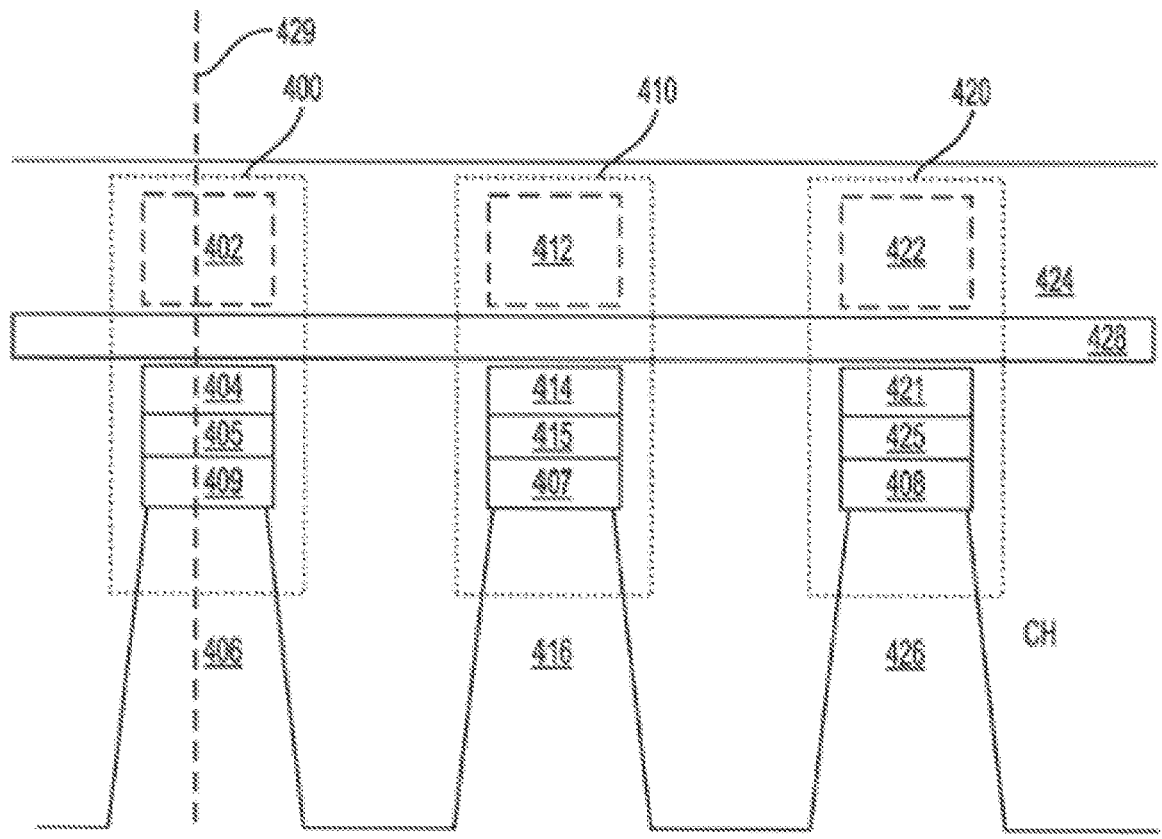
FIG. 4A - PRIOR ART
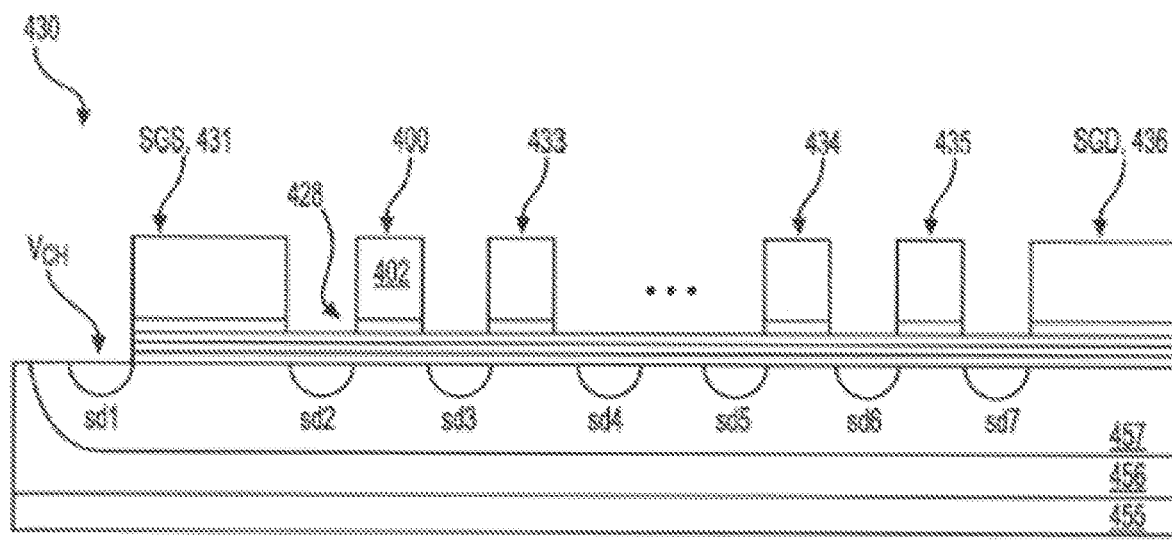
FIG. 4B - PRIOR ART

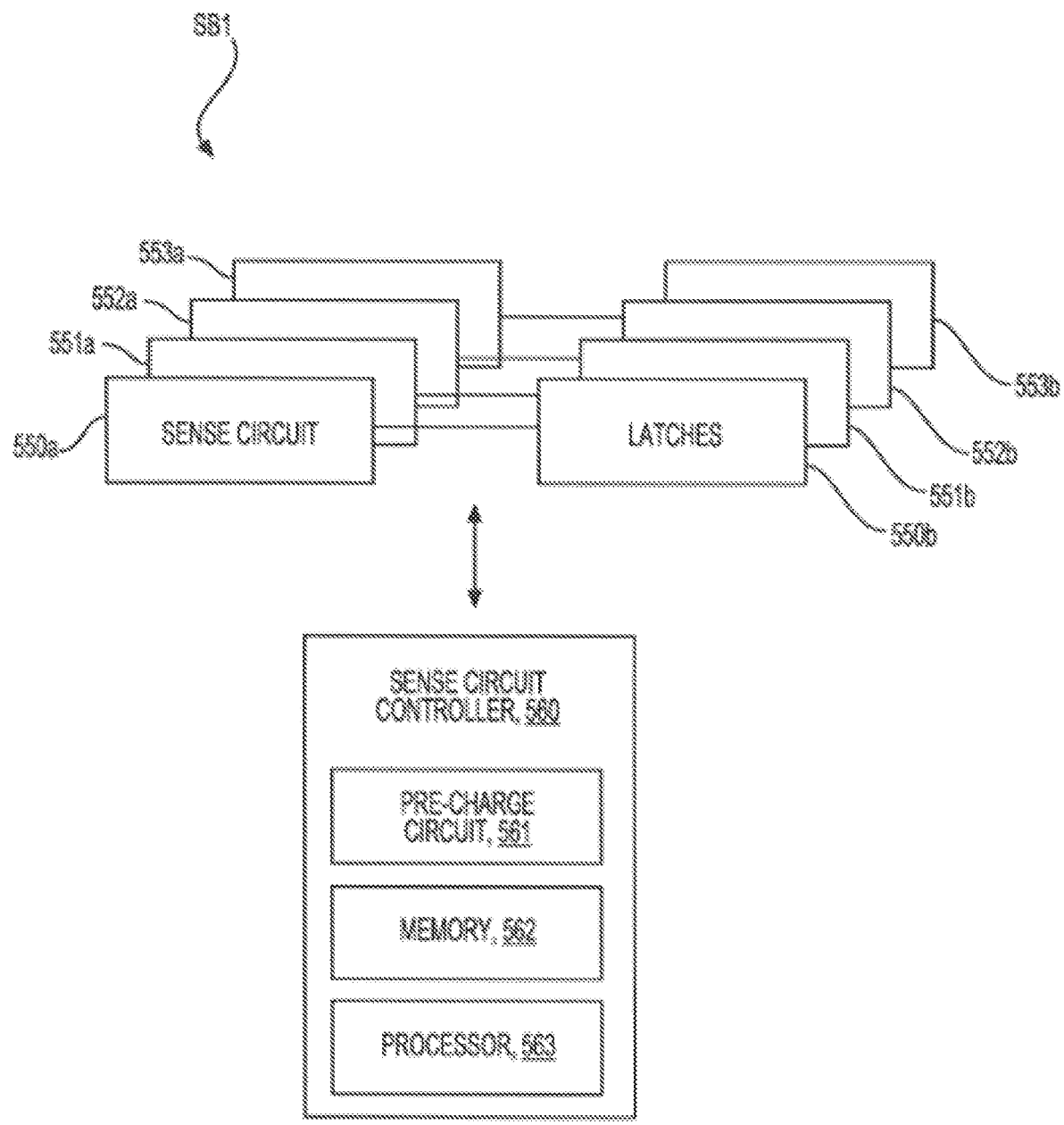
FIG. 5 - PRIOR ART

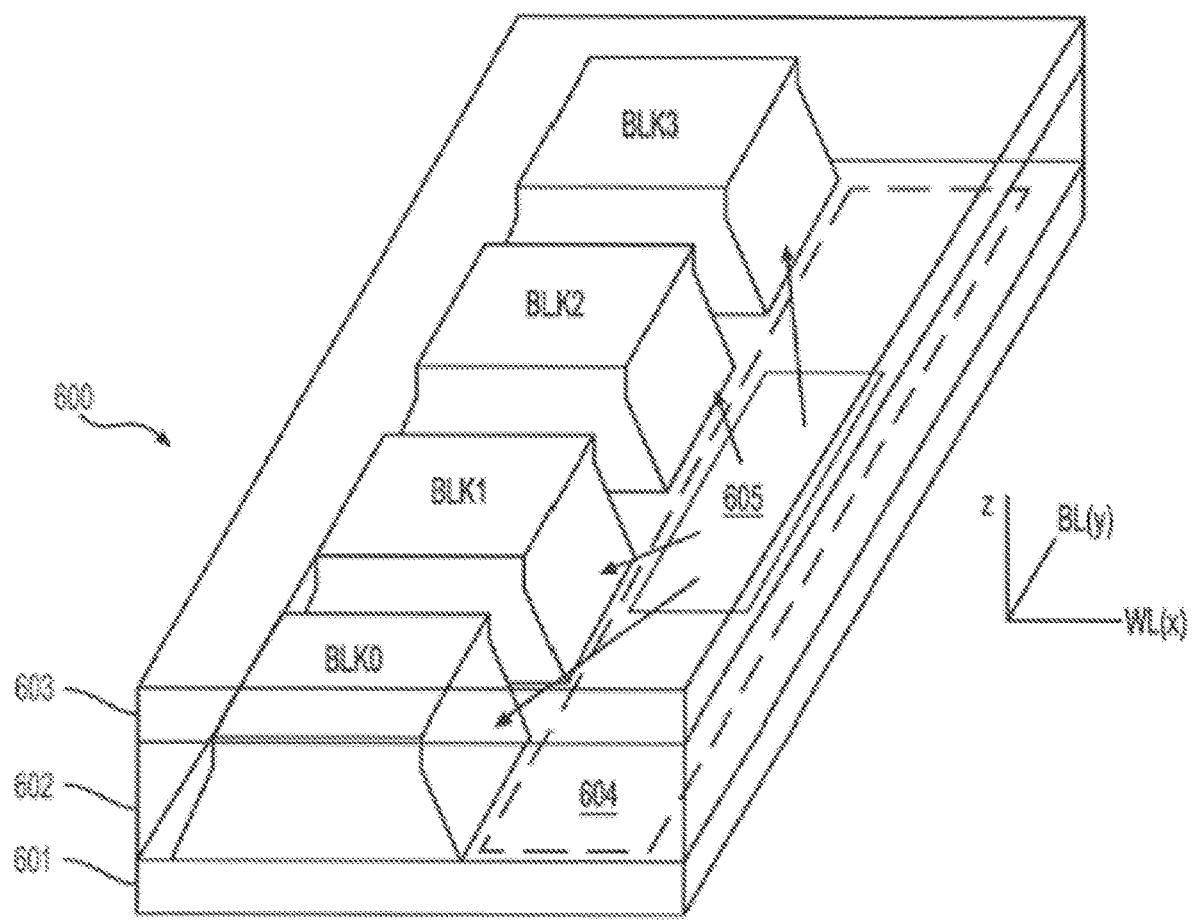
FIG. 6A - PRIOR ART

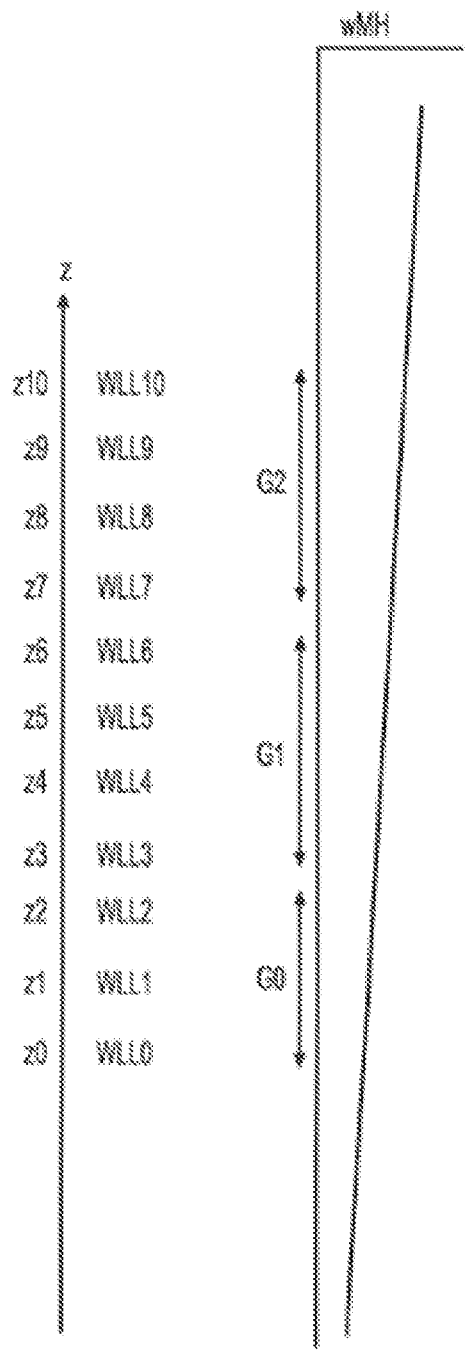
FIG. 6C - PRIOR ART

SYSTEMS AND METHODS FOR ADJUSTING THRESHOLD VOLTAGE DISTRIBUTION DUE TO SEMI-CIRCLE SGD

TECHNICAL FIELD

This application is directed to utilizing memory holes in which the edges are cut/altered, thus defining semi-circle memory holes. In particular, this application is directed to optimizing a threshold voltage semi-circle memory holes. The optimized threshold voltages of semi-circle memory holes can better match the threshold voltages of full circle memory holes.

BACKGROUND

Semi-circle drain side select gate ("SC-SGD") memory technology offers several advantages, including reduced die size. In order to produce SC-SGD, etching technology is used to cut memory holes, thus giving them their semi-circular shape, and separating a block or row into several strings. Depending upon the process used to form the SC-SGD, certain issues can occur. For example, cutting a memory hole will remove at least some portions of the SC-SGD, such as the metal layer that otherwise shields electrical fields from the channel and/or charge trap layer. As a result, the SC-SGD can be influenced by a "neighboring" electric field, causing a parasitic transistor to leak along the SC-SGD transistor. In some cases, this causes a sensing amplifier to incorrectly determine the SC-SGD is conducting, which can affect certain sensing operations. Additionally, neighboring electrical fields are known to distort (e.g., shift down) the threshold voltage of SC-SGD, and thus alter the overall threshold voltage of a memory structure.

SUMMARY

An aspect of the present disclosure is related to a method for accessing a memory device. The method includes biasing, using a first voltage, a first semi-circular drain side select gate (SC-SGD). The first SC-SGD is located on a first edge of a etched region. The method continues with biasing, using a second voltage that is less than the first voltage, a second SC-SGD. The second SC-SGD is located on a second edge of the etched region opposite the first edge. A controller, including but not limited to a SSD controller, is used to carry out the steps.

In an embodiment, the second voltage comprises a negative voltage.

In an embodiment, the negative voltage is less than zero volts.

In an embodiment, the etched region comprises a shallow hole etch (SHE) cut.

In an embodiment, the negative voltage selected is based upon a width of the SHE cut.

In an embodiment, during a programming operation, the method continues with providing a program pulse to a data word line of the memory device. The method continues with biasing, using a verify voltage, the first SC-SGD. The first SC-SGD is programmed during the program operation. The method continues with biasing, using a negative verify voltage, the second SC-SGD.

In an embodiment, during a read operation, the method continues with selecting, using the first SC-SGD, a string to read. The method continues with biasing, using a read voltage, the first SC-SGD. The method continues with biasing, using a negative read voltage, the second SC-SGD.

According to another aspect of the disclosure, a memory system includes a memory device. The memory system includes a controller operatively coupled to the memory device. The controller is configured to bias, using a first voltage, a first semi-circular drain side select gate (SC-SGD). The first SC-SGD is located on a first edge of a etched region. The controller is further configured to bias, using a second voltage that is less than the first voltage, a second SC-SGD. The second SC-SGD is located on a second edge of the etched region opposite the first edge.

In an embodiment, the second voltage comprises a negative voltage.

In an embodiment, the negative voltage is less than zero volts.

In an embodiment, the etched region comprises a shallow hole etch (SHE) cut.

In an embodiment, the negative voltage selected is based upon a width of the SHE cut.

In an embodiment, during a programming operation, the controller is further configured to provide a program pulse to a data word line of the memory device. The controller is further configured to bias, using a verify voltage, the first SC-SGD. The first SC-SGD is programmed during the program operation. The controller is further configured to bias, using a negative verify voltage, the second SC-SGD.

In an embodiment, during a read operation, the controller is further configured to select, using the first SC-SGD, a string to read. The controller is further configured to bias, using a read voltage, the first SC-SGD. The controller is further configured to bias, using a negative read voltage, the second SC-SGD.

According to another aspect of the disclosure, a non-transitory computer readable storage medium configured to store instructions that, when executed by a processor included a controller of a memory system, cause the memory system to carry out steps to bias, using a first voltage, a first semi-circular drain side select gate (SC-SGD). The first SC-SGD is located on a first edge of a etched region. The instructions further cause the memory system to carry out steps to bias, using a second voltage that is less than the first voltage, a second SC-SGD. The second SC-SGD is located on a second edge of the etched region opposite the first edge.

In an embodiment, the second voltage comprises a negative voltage.

In an embodiment, the negative voltage is less than zero volts.

In an embodiment, the etched region comprises a shallow hole etch (SHE) cut.

In an embodiment, the negative voltage selected is based upon a width of the SHE cut.

In an embodiment, the instructions further cause the memory system to carry out steps to provide a program pulse to a data word line of the memory device. The instructions further cause the memory system to carry out steps to bias, using a verify voltage, the first SC-SGD. The first SC-SGD is programmed during the program operation. The instructions further cause the memory system to carry out steps to bias, using a negative verify voltage, the second SC-SGD.

In an embodiment, during a read operation, the instructions further cause the memory system to carry out steps to select, using the first SC-SGD, a string to read. The instructions further cause the memory system to carry out steps to bias, using a read voltage, the first SC-SGD. The instructions further cause the memory system to carry out steps to bias, using a negative read voltage, the second SC-SGD.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope, the disclosure is described and explained with added specificity and detail through the use of the accompanying drawings in which:

FIG. 1A is a block diagram of an example memory device;

FIG. 1B is a block diagram of an example control circuit that includes a programming circuit, a counting circuit, and a determination circuit;

FIG. 2 illustrates schematic views of three types of memory architectures utilizing staggered memory strings;

FIG. 3A illustrates a cross-sectional view of example floating gate memory cells in NAND strings;

FIG. 3B illustrates a cross-sectional view along a contact line shown in FIG. 3A;

FIGS. 4A and 4B illustrate non-volatile memory in which a charge-trapping memory cell uses a non-conductive dielectric material in place of a conductive floating gate to store charge in a non-volatile manner;

FIG. 5 illustrates an example block diagram of the sense block of FIG. 1;

FIG. 6A is a perspective view of a set of blocks in an example three-dimensional configuration of the memory array of FIG. 1;

FIG. 6C illustrates a plot of memory hole diameter in the stack of FIG. 6B;

DETAILED DESCRIPTION

Figure 6B:
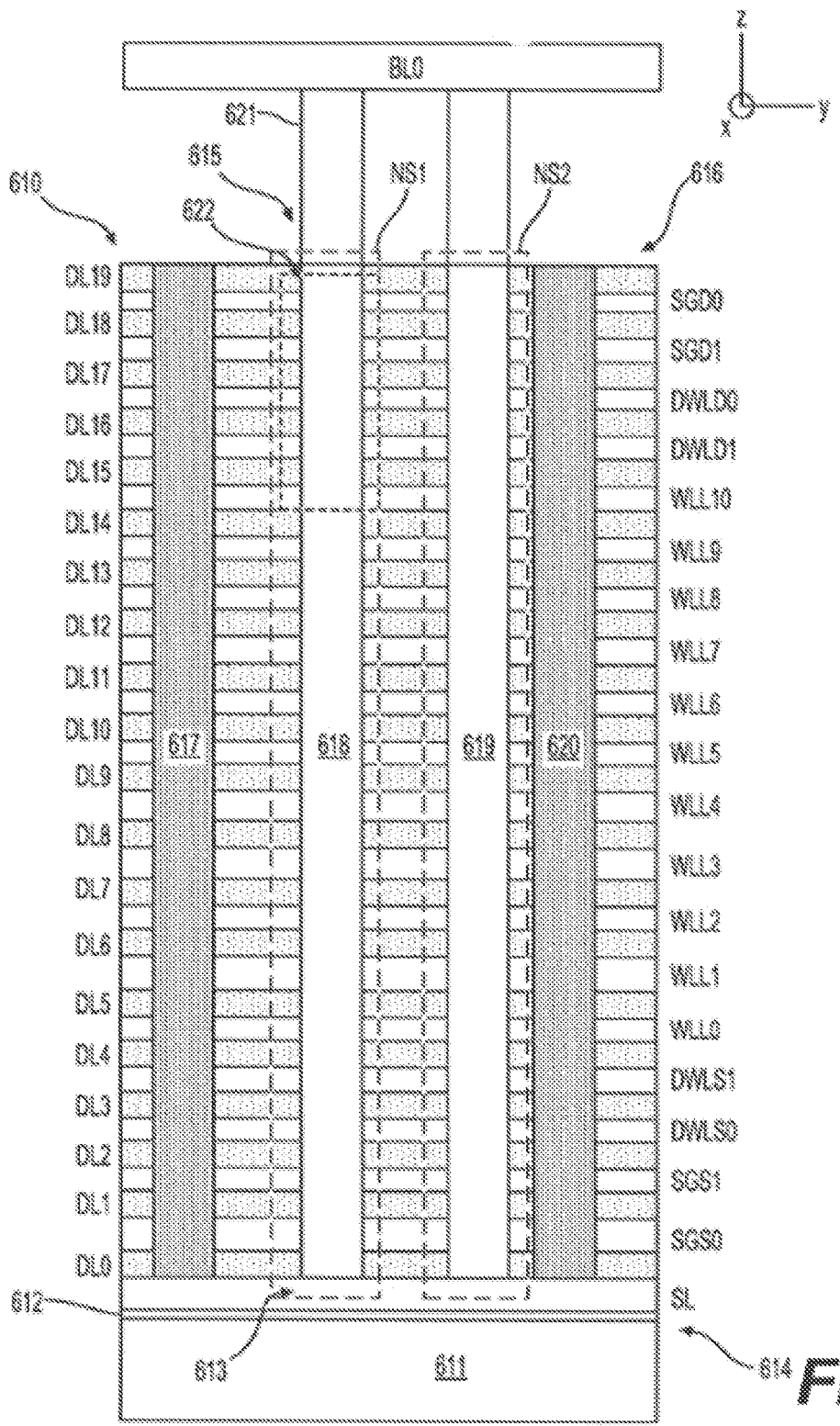
FIG. 6B illustrates an example cross-sectional view of a portion of one of the blocks of FIG. 6A.

The following description is directed to various exemplary embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the detailed explanation of any specific embodiment is meant only to be exemplary of that embodiment and is not intended to suggest that the scope of the disclosure, including the claims, is limited to that particular embodiment.

The following disclosure is directed to mitigating issues related to semi-circle drain side select gate (SC-SGD) memory holes in memory structures. In particular, this disclosure is directed to ways to manage threshold voltage (Vt) of SC-SGD, as Vt of SC-SGD is altered and thus differs from Vt of full circle drain side select gate ("FC-SGD") memory holes. When creating various rows and strings for a memory structure, a cutting operation (e.g., shallow hole etch, or SHE) can be used. However, this operation will cut away parts of some rows of memory holes, resulting in SC-SGD. When SC-SGD memory holes are being programmed, both a selected and unselected SGD require a bias voltage. Depending on the bias voltage on the unselected SGD, the selected SGD can be exposed to the bias voltage causing interference, referred to as neighboring select gate interference ("NSI"), and turn on parasitic transistors, resulting in leakage current. In order to mitigate or prevent bias voltage issues, the bias voltage on the unselected SGD can be reduced to 0 Volts ("V") or a negative voltage (e.g., −2V). By reducing the bias voltage in this manner, unwanted current leakage through parasitic transistors is prevented and the current flow is controlled through the selected SGD transistor, which can be properly monitored by a sensing amplifier.

Additionally, a self-compensated select gate programming method is proposed to address neighbor SGD interference ("NSI") effect. The method uses the neighboring electric field (that biases the unselected SGD) that "attacks," or interferes with, the selected SGD during verify/program operation to turn on semi-circle SGD cells, or at least a portion thereof. After subsequent program pulse, the neighboring electric field is exploited and used for several purposes.

First, the neighboring electric field leads to extra trap charge compensation inside SC-SGD with larger neighbor coupling. Also, the neighboring electric field leads to less extra trap charge compensation inside SC-SGD with less neighbor coupling. Further, there is no extra trap charge compensation inside full circle drain side select gate ("FC-SGD"). The extra trap charges are self-adaptive to the neighboring electric field and thus provides NSI compensation automatically. All these self-compensation happens concurrently without sacrificing performance and without substantial design cost increase.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Further, the terms "program," "software," "software application," and the like as may be used herein, refer to a sequence of instructions that is designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions that is designed for execution on a computer system.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

In the detailed description that follows, reference is made to the appended drawings, which form a part thereof. It is recognized that the foregoing summary is illustrative only and is not intended to be limiting in any manner. In addition to the illustrative aspects, example embodiments, and features described above, additional aspects, exemplary embodiments, and features will become apparent by reference to the drawings and the detailed description below. The description of elements in each figure may refer to elements of proceeding figures. Like reference numerals may refer to like elements in the figures, including alternate exemplary embodiments of like elements.

FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one word line after which the programming circuit applies a verification signal to the one word line. The control circuits can also include a counting circuit configured to obtain a count of memory cells which pass a verify test for the one data state. The control circuits can also include a determination circuit configured to determine, based on an amount by which the count exceeds a threshold, a particular program and verify iteration among the plurality of program and verify iterations in which to perform a verify test for another data state for the memory cells assigned to represent another data state.

For example, FIG. 1B is a block diagram of an example control circuit 150 which comprises a programming circuit 151, a counting circuit 152, and a determination circuit 153.

The off-chip controller 122 may comprise a processor 122*c*, storage devices (memory) such as ROM 122*a* and RAM 122*b* and an error-correction code (ECC) engine 245. The ECC engine can correct a number of read errors which are caused when the upper tail of a Vth distribution becomes too high. However, uncorrectable errors may exist in some cases. The techniques provided herein reduce the likelihood of uncorrectable errors.

The storage device(s) 122*a*, 122*b* comprise, code such as a set of instructions, and the processor 122*c* is operable to execute the set of instructions to provide the functionality described herein. Alternately or additionally, the processor 122*c* can access code from a storage device 126*a* of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122*c* fetches the boot code from the ROM 122*a* or storage device 126*a* for execution, and the boot code initializes the system components and loads the control code into the RAM 122*b*. Once the control code is loaded into the RAM 122*b*, it is executed by the processor 122*c*. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

FIG. 2 illustrates schematic views of three types of memory architectures utilizing staggered memory strings. For example, reference number 201 shows a schematic view of a first example memory architecture, reference number 203 shows a schematic view of a second example memory architecture, and reference number 205 shows a schematic view of a third example memory architecture. In some embodiments, as shown, the memory architecture may include an array of staggered NAND strings.

FIG. 2 illustrates blocks 200, 210 of memory cells in an example two-dimensional configuration of the memory array 126 of FIG. 1. The memory array 126 can include many such blocks 200, 210. Each example block 200, 210 includes a number of NAND strings and respective bit lines, e.g., BL0, BL1, . . . which are shared among the blocks. Each NAND string is connected at one end to a drain-side select gate (SGD), and the control gates of the drain select gates are connected via a common SGD line. The NAND strings are connected at their other end to a source-side select gate (SGS) which, in turn, is connected to a common source line 220. Sixteen word lines, for example, WL0-WL15, extend between the SGSs and the SGDs. In some cases, dummy word lines, which contain no user data, can also be used in the memory array adjacent to the select gate transistors. Such dummy word lines can shield the edge data word line from certain edge effects.

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage ("Vt") of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this Figure, a bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

As an alternative, as shown in FIGS. 4A and 4B, the flat or planar memory cell 400, 410, 420 has been developed in which the control gate 402, 412, 422 is flat or planar; that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 424 extends across NAND strings which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414, 421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, . . . 435, and an SGD transistor 436. Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (O) such as in a N-O-N-O-N configuration.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

FIG. 5 illustrates an example block diagram of the sense block SB1 of FIG. 1. In one approach, a sense block comprises multiple sense circuits. Each sense circuit is associated with data latches. For example, the example sense circuits 550a, 551a, 552a, and 553a are associated with the data latches 550b, 551b, 552b, and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code which is executable by the processor to perform the functions described herein. These functions can include reading the latches 550b, 551b, 552b, 553b which are associated with the sense circuits 550a, 551a, 552a, 553a, setting bit values in the latches and providing voltages for setting pre-charge levels in sense nodes of the sense circuits 550a, 551a, 552a, 553a. Further example details of the sense circuit controller 560 and the sense circuits 550a, 551a, 552a, 553a are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

FIG. 6A is a perspective view of a set of blocks 600 in an example three-dimensional configuration of the memory array 126 of FIG. 1. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605 which can be connected to control gate layers of the blocks BLK0, BLK1, BLK2, BLK3. In one approach, control gate layers at a common height in the blocks BLK0, BLK1, BLK2, BLK3 are commonly driven. The substrate 601 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack 610 which comprise NAND strings NS1 and NS2 are illustrated. Each NAND string encompasses a memory hole 618, 619 which is filled with materials which form memory cells adjacent to the word lines. A region 622 of the stack 610 is shown in greater detail in FIG. 6D and is discussed in further detail below.

The 610 stack includes a substrate 611, an insulating film 612 on the substrate 611, and a portion of a source line SL. NS1 has a source-end 613 at a bottom 614 of the stack and a drain-end 615 at a top 616 of the stack 610. Contact line connectors (e.g., slits, such as metal-filled slits) 617, 620 may be provided periodically across the stack 610 as interconnects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WLL0-WLL10 of FIG. 6A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
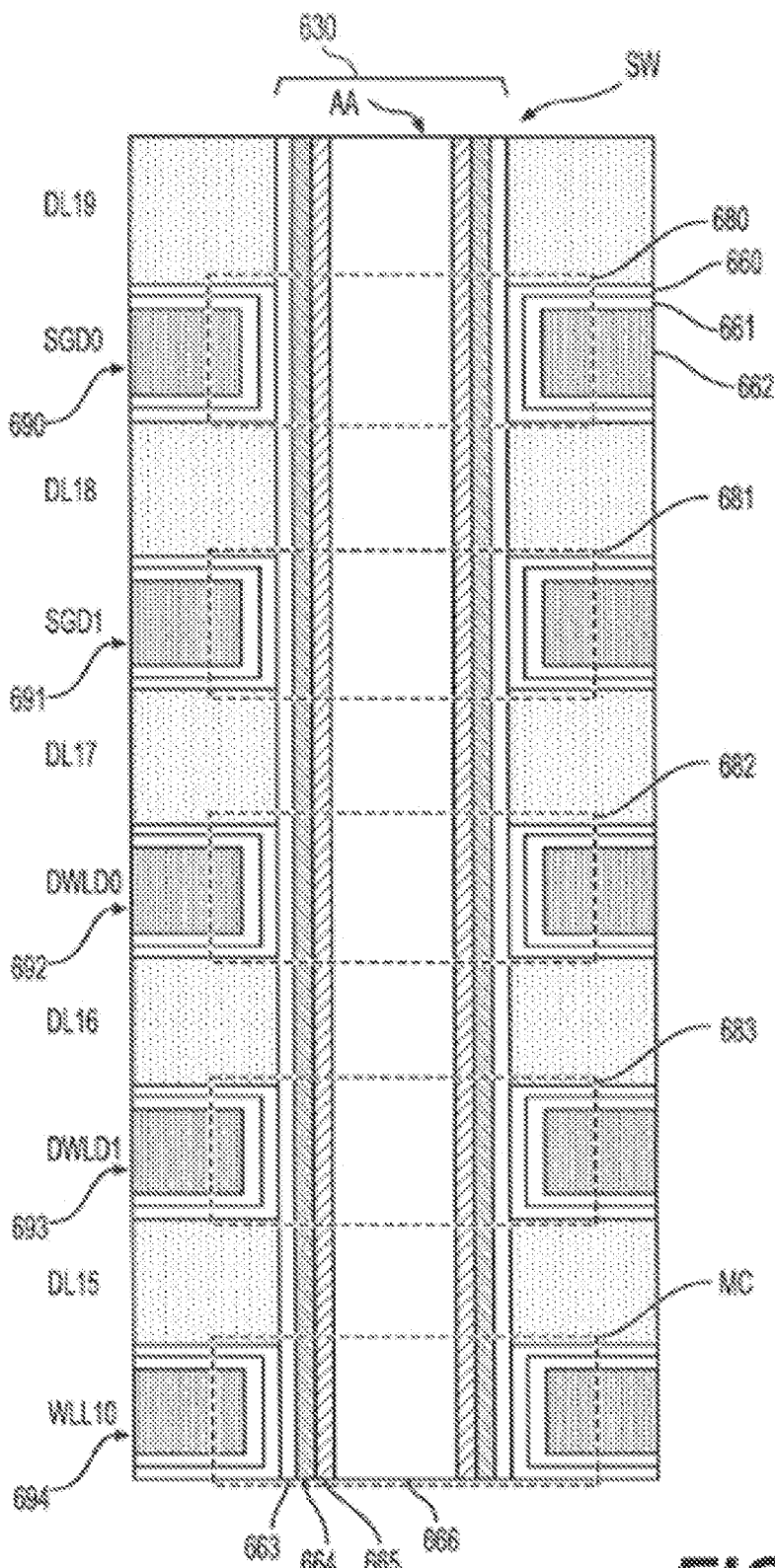
FIG. 6D illustrates a close-up view of the region of the stack of FIG. 6B.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in the different memory holes. A pillar can form a columnar active area (AA) of a NAND string.

When a data memory cell MC is programmed, electrons are stored in a portion of the charge-trapping layer 663 which is associated with the memory cell MC. These electrons are drawn into the charge-trapping layer 663 from the channel 665, and through the tunneling layer 664. The Vth of a memory cell MC is increased in proportion to the amount of stored charge. During an erase operation, the electrons return to the channel 665.

Each of the memory holes 630 can be filled with a plurality of annular layers comprising a blocking oxide layer, a charge trapping layer 663, a tunneling layer 664 and a channel layer 665. A core region of each of the memory holes 630 is filled with a body material, and the plurality of annular layers are between the core region and the word line in each of the memory holes 630.

The NAND string can be considered to have a floating body channel 665 because the length of the channel 665 is not formed on a substrate. Further, the NAND string is provided by a plurality of word line layers above one another in a stack, and separated from one another by dielectric layers.

Figure 7A:
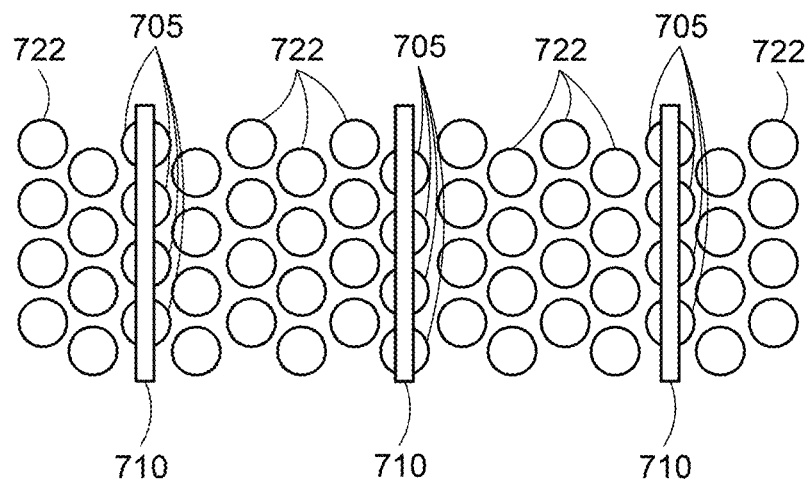
FIG. 7A illustrates a schematic plan view of a memory array with a plurality of memory holes.

FIG. 7A shows a schematic plan view of a memory array 700 with a plurality of memory holes 722, which can be vertical memory cell strands as described herein, and a plurality of dummy holes 705, which need not one complete memory structures. A shallow trench etch or shallow etching feature (SHE) 710 extends through a plurality of word lines (for example, five) but not fully through the chip to electrically isolate adjacent strings from one another. The SHE extends directly through a group of aligned dummy holes 705, thereby preventing those dummy holes 705 from storing data or otherwise being functional memory cells.

Figure 7B:
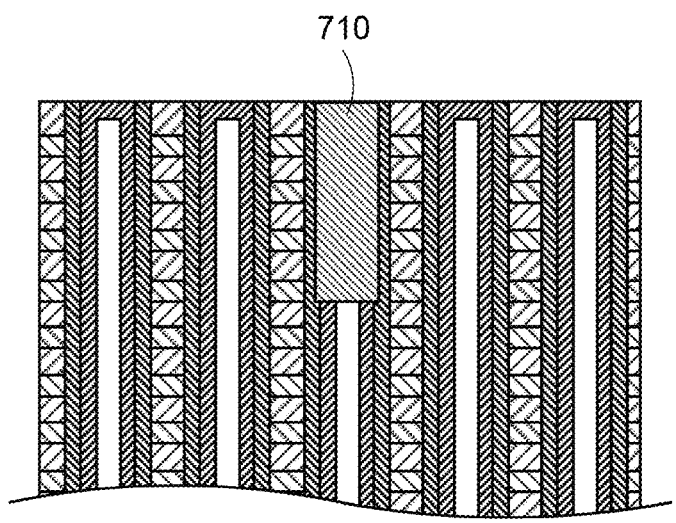
FIG. 7B illustrates a cross-sectional view of the memory array.
Figure 8A:
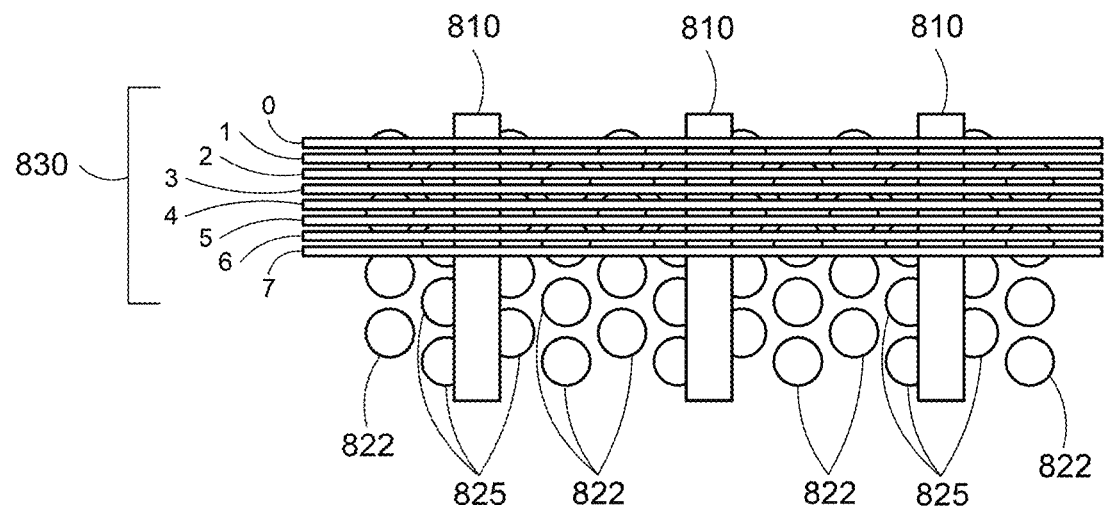
FIGS. 8A and 8B illustrate an alternate memory structure with no dummy holes.
Figure 8B:
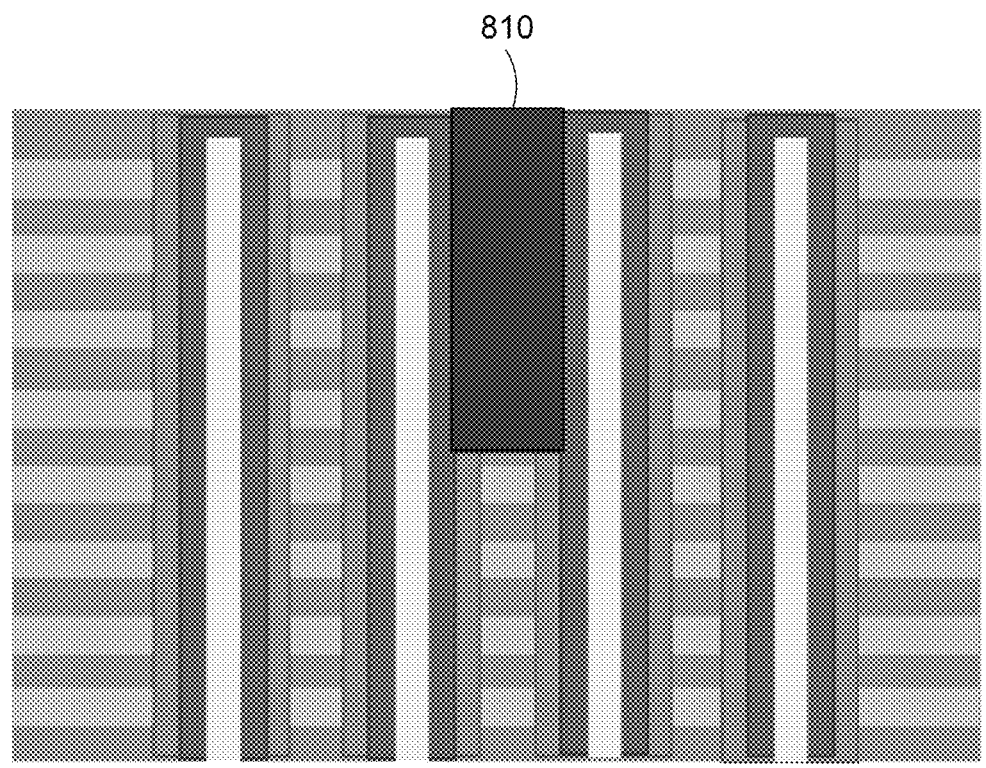

Referring now to FIGS. 8A and 8B, there are no dummy holes. Unlike the memory structure 700 of FIGS. 7A and 7B, the SHE 810 is located in a gap between two adjacent rows of memory cells 825 and overlaps with memory holes 825, thereby creating a working strand that has a trench etched down into a side of at least the SGD switch at the top of the working memory strand, here shown as memory holes 825. This configuration substantially improves yield and memory density as all of the memory holes 822, 825 are functional, i.e., fewer memory holes are wasted.

Unlike the fully circular memory holes 822, the memory holes 825 and the SGD switches that are partially cut by the SHE 810 have a semi-circular shape, which can either be a half circle or can be more or less than a half-circle. In some cases, the memory holes 825 and SGD switches can be less than half circles on one side of the SHE 810 and more than half circles on the other side of the SHE 810.

The memory holes 822, 825 are connected with a plurality of bit lines 830 (labeled as bit lines 0-7 in FIG. 8A). For ease of illustration, only eight bit lines 830 have been shown. The bit lines 830 extend over above the memory holes and are connected to select memory holes via connection points. The memory holes in each string area also connected at one end to an SGD switch and at the other end to an SGS switch. The SHE trench 810 may be etched into a portion of the SGD switch.

Figure 9:
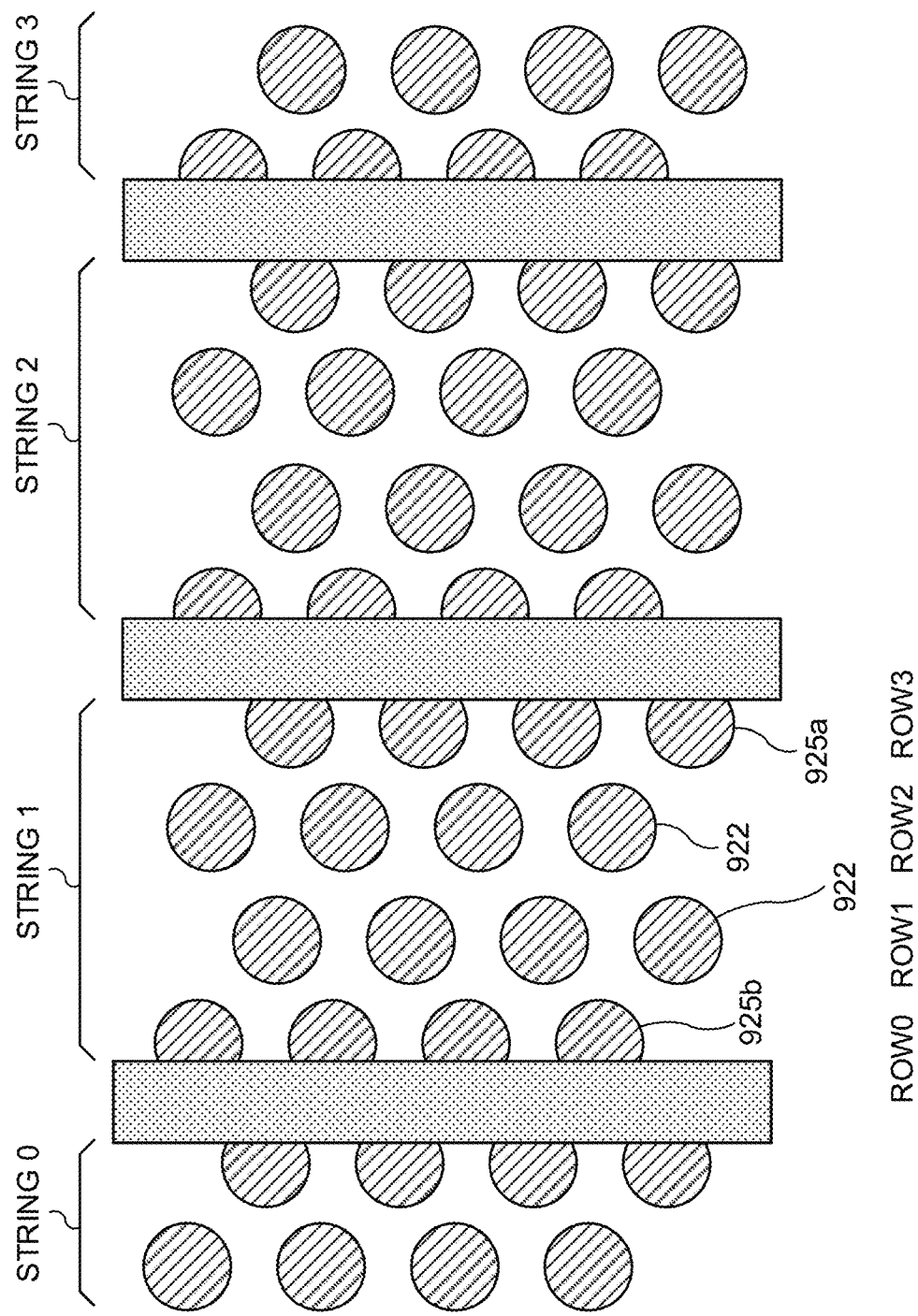
FIG. 9 illustrates an embodiment of a memory array with memory holes cut to different sizes based upon the SHE cutting operation.

Referring now to FIG. 9, due to variations and imperfections in a manufacturing operation, the SHE may be non-centrally located between adjacent rows of memory holes. When this occurs, the semi-circular SGDs on one side of the SHE trench may be dimensionally larger than the semi-circular SGDs on the other side of the SHE trench. The memory holes including the dimensionally larger SGDs are hereinafter called "undershifted SGDs," and the memory holes including the dimensionally smaller SGDs are hereinafter referred to as "overshifted memory holes." As illustrated, each string has one row of undershifted semi-circular SGDs, two rows of full-circle SGDs, and one row of overshifted semi-circular SGDs. With reference to String 1, Row 0 includes overshifted semi-circle SGDs 925b; Rows 1 and 2 include full-circle SGDs 922; and Row 3 includes undershifted semi-circle SGDs 925a.

Figure 10:
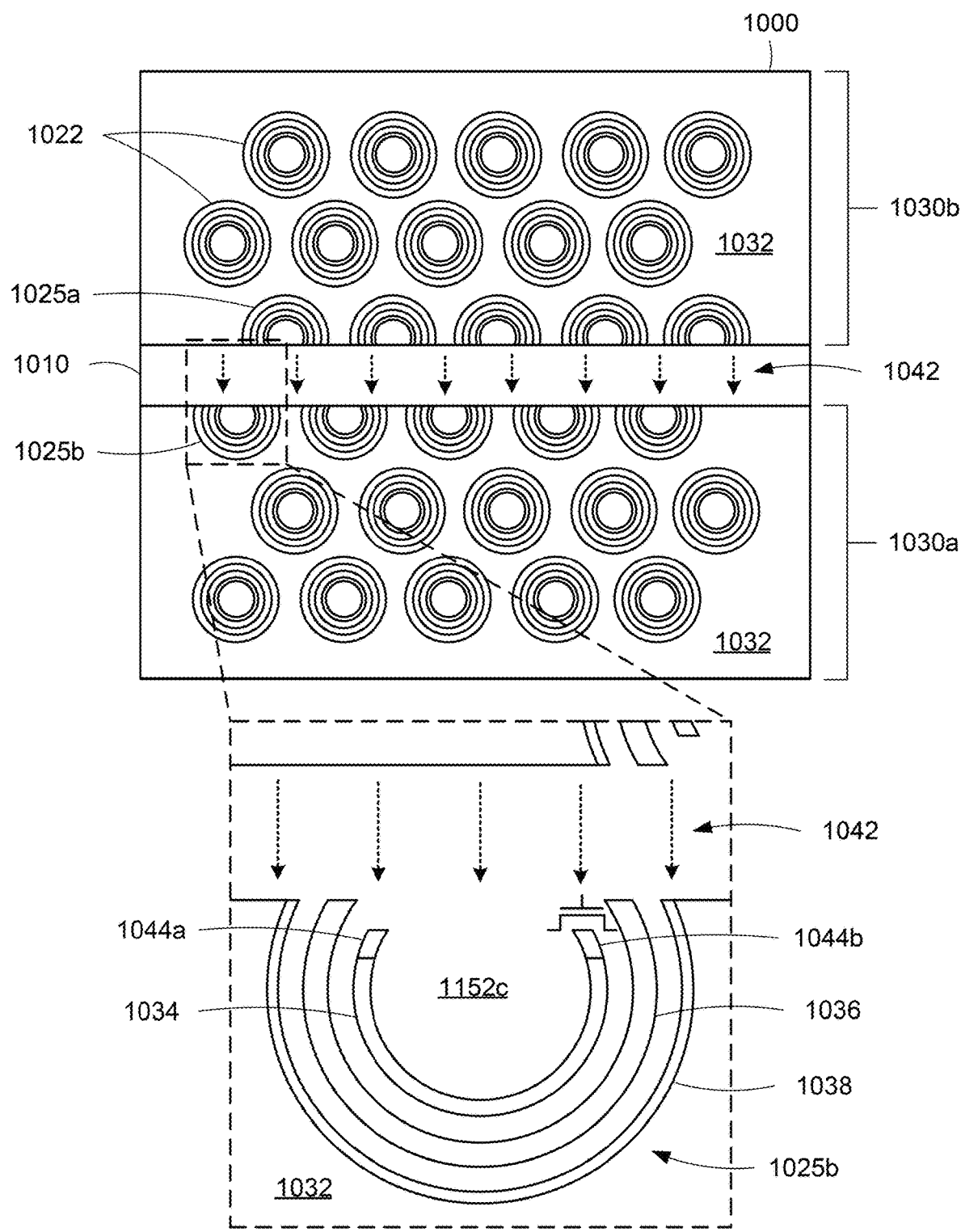
FIG. 10 illustrates a memory structure showing several memory holes cut by a SHE, in accordance with some described embodiments.

FIG. 10 illustrates a memory structure 1000 showing several memory holes cut by a SHE 1010, in accordance with some described embodiments. The memory structure 1000 includes several FC-SGD memory holes 1022 (representative of several additional FC-SGD) as well as several SC-SGD memory holes 1025a and 1025b (representative of several additional SC-SGD), with the SC-SGD memory holes 1025a and 1025b cut by the SHE 1010. Additionally, the memory holes of the memory structure 1000 are surrounded by a metal layer 1032, such as a Tungsten metal layer During certain operations (e.g., a read operation), a bias voltage is placed on two regions (divided by the SHE 1010). For example, during a read option, a bias voltage is applied to a region1030a of memory holes so that strings of memory connected to the memory holes in the region 1030a can be read. This region 1030a may be referred to as a selected SGD. However, at the same time, a bias voltage is applied to a region 1030b of memory holes that is not selected for reading. This region 1030b may be referred to as an unselected SGD.

The SHE 1010 creates an electrical isolation, thus separating the regions 1030a and 1030b from each other. However, as shown in the enlarged view the SHE 1010 cuts and removes portions of SC-SGD, such as the memory hole 1025b. For example, the memory hole 1025b includes a channel 1034 (used as a passageway for electrons), a charge trap layer 1036 (used to store electrons and determine Vt), and a dielectric layer 1038, such as alumina (used to block external electrical fields). Additionally, an oxide layer 1040 extends into the memory hole 1025b and separates the channel 1034 from the charge trap layer 1036, and also separates the charge trap layer 1036 from the dielectric layer 1038. These aforementioned features—channel 1034, charge trap layer 1036, and the dielectric layer 1038 — are found in both FC-SGD and SC-SGD.

In full circle memory holes, the respective channels, charge trap layers, and the metal layers each resemble a ring. However, due to the SHE 1010, portions of the channel 1034, charge trap layer 1036, and the dielectric layer 1038 partially removed. While the memory 1025b, having features partially removed, is still functional, certain issues arise. For example, due to the partial removal of the dielectric layer 1038, both the channel 1034 and the charge trap layer 1036 are exposed to an electrical field 1042 (represented by arrows) due to the bias voltage placed on the region 1030b (unselected SGD) during the read operation. As a result, the end regions 1044a and 1044b (or tips) of the channel 1034 can essentially turn on during the read operation, causing the end regions 1044a and 1044b to become conducting. A diagram of a transistor (not labeled) represents a gate of the end regions 1044a and 1044b that can be turned on. This can in turn effectively lower the Vt of the memory hole 1025b required to turn on the channel 1034. This illustrates an issue of NSI. Also, it should be noted that the memory hole 1025b is generally representative of other SC-SGD memory holes in FIG. 10. However, the degree to which each memory hole is cut by the SHE 1010 may differ.

Figure 11:
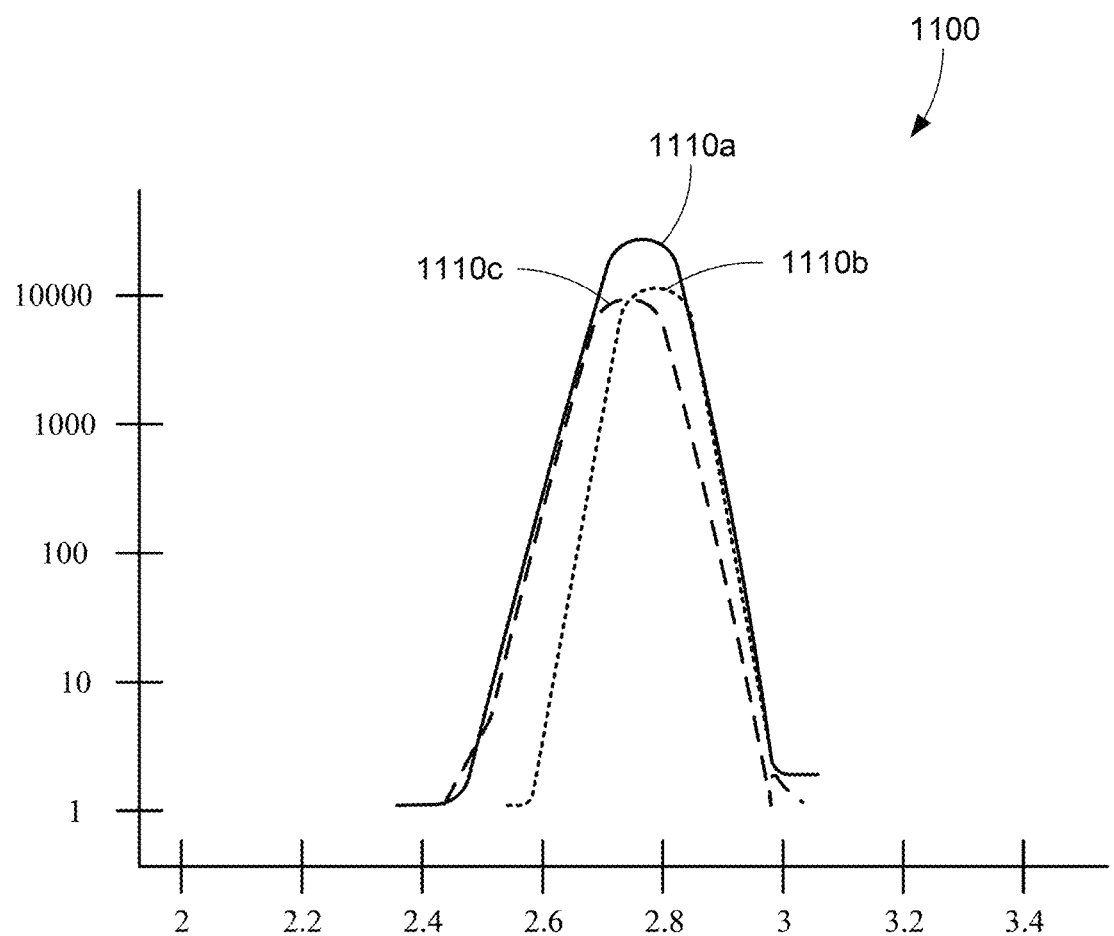
FIG. 11 illustrates a graph showing Vt distribution for a memory structure with memory holes, in accordance with some described embodiments.

FIG. 11 illustrates a graph 1100 showing Vt distribution for a memory structure with memory holes, in accordance with some described embodiments. The counts (program-erase cycles) vs Vt is shown. A curve 1110a represents the Vt distribution for all SGD memory holes. Also, a curve 1110b represents the Vt distribution for all FC-SGD memory holes, while a curve 1110c represents the Vt distribution for all SC-SGD memory holes. In this regard, the curves 1110b and 1110b represents the components of the curve 1110a. The curve 1110c shows the Vt distribution will "downshift," or reduce, the overall Vt distribution. Also, the effect of SC-SGD widens the curve 1110a (overall curve), making the Vt distribution less predictable. Several modifications shown and described below are used to overcome these challenges of using SC-SGD.

Figure 12:
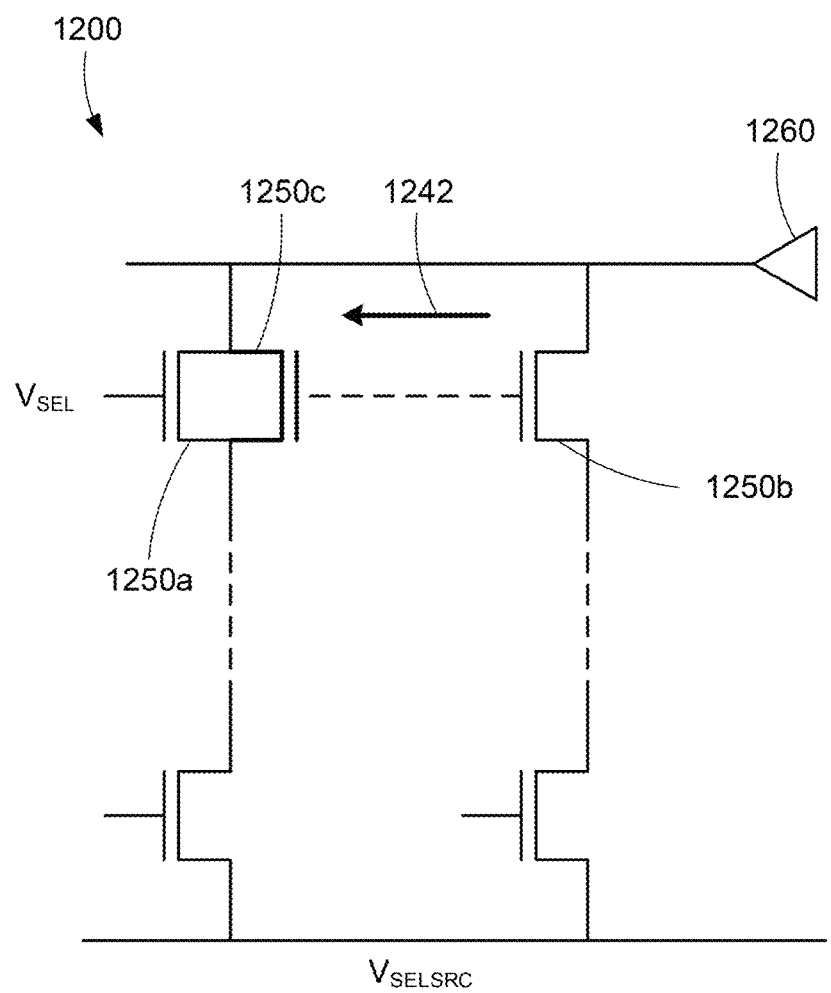
FIG. 12 illustrates a circuit diagram illustrates transistors for a selected gate and an unselected gate.

FIG. 12 illustrates a circuit diagram 1200 illustrates transistors for a selected gate and an unselected gate. As shown, a transistor 1250a represents a selected SC-SGD memory hole, such as the memory hole 1025b (shown in FIG. 10). In particular, the transistor 1250a represents the end regions 1044a and 1044b (shown in FIG. 10). The transistor 1250a is designed to turn on based upon a predetermined select gate voltage, $V_{SEL}$. Also, a transistor 1250b represents an un-selected SC-SGD memory hole, such as the memory hole 1025a (shown in FIG. 10). Additionally, a transistor 1250c (a parasitic transistor) is in parallel with the transistor 1250a. Ideally, the circuit transmits current when $V_{SEL}$ is sufficiently high on the transistor 1250a. However, when a bias voltage is placed on the transistor 1250b (for example, during a read operation), an electric field 1242, referred to as NSI, can cause the transistor 1250c to turn on. When this occurs, leakage current passes to the source, causing a sensing amplifier 1260 to determine that the transistor 1250a is conducting when the transistor 1250a is not turned on, while the transistor 1250c, acting as a parasitic transistor, is conducting.

The equation to determine whether the electric field 1242 is sufficient to turn on the transistor 1250c can be governed by:

$$V_{OD} = \alpha * V_{ATTACKER} - V_{SELSRC} \qquad \text{Eq. (1)}$$

where $V_{OD}$ is the overdrive voltage, α is a coupling factor (based on the width of the SHE, and will be further described below), $V_{ATTACKER}$ is the "attacking" or interference voltage due to NSI, and $V_{SELSRC}$ is the source line voltage. $V_{ATTACKER}$ is also based on the resultant voltage due to the bias voltage applied to the unselected gate. It can be seen that $V_{OD}$ is similar to a traditional transistor formula, such as a gate-source voltage ("$V_{GS}$"). Further, it can be seen that $V_{OD}$ is dependent upon, and proportional to $V_{ATTACKER}$ (provided α is greater than 0). Accordingly, the transistor 1250c will turn on when $V_{OD}$ is sufficiently high, which corresponds to $V_{ATTACKER}$ being sufficiently high.

In order to sufficiently reduce $V_{OD}$ from turning on the transistor, the electric field 1242 can be sufficiently reduced by manipulating $V_{ATTACKER}$. For example, placing a negative bias, such as −2V on the unselected gate, the voltage inducted on the transistor 1250c by the electric field can be sufficiently reduced (in some cases to 0 V). As a result, the transistor 1250c does not inadvertently turn on, and current is only allowed to pass through the transistor 1250a provided $V_{SEL}$ is sufficiently high. In order to provide the negative voltage, additional modifications, such as a triple well transistor, can be used.

Figure 13:
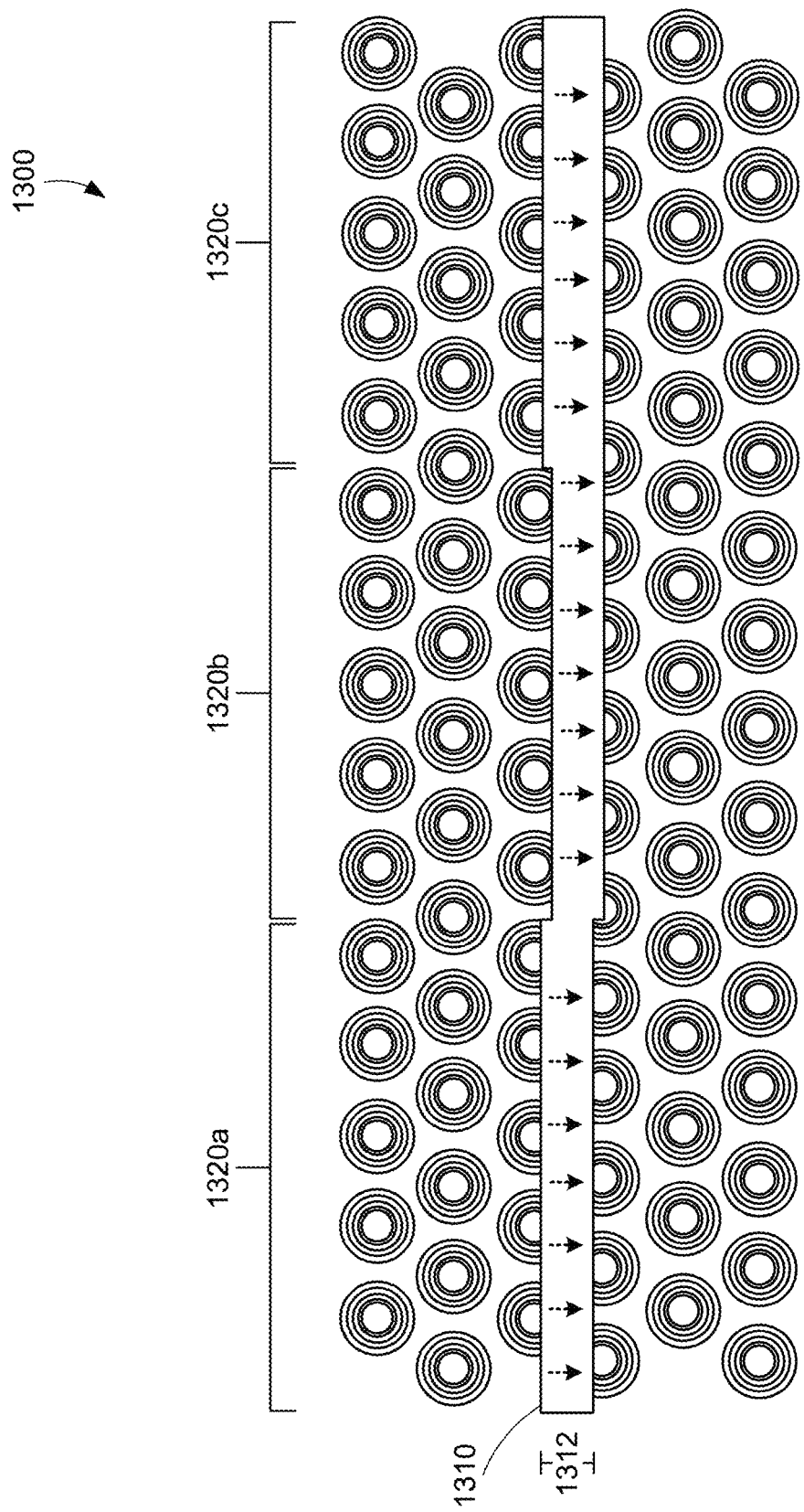
FIG. 13 illustrates a memory structure showing several memory holes cut by a SHE, further showing process variations in the SHE, in accordance with some described embodiments.

FIG. 13 illustrates a memory structure 1300 showing several memory holes cut by a SHE 1310, further showing process variations in the SHE 1310, in accordance with some described embodiments. As shown, the SHE 1310 is divided into different sections, representing the different process variations. For example, a section 1320a represents part of the SHE 1310. The section 1320a is generally similar to prior embodiments shown and described for a SHE, and may also represent a target, or ideal, cut in terms of width 1312 and location that is desired by the manufacture of the memory structure 1300. However, other sections may inadvertently have variations, due in part to the operation that forms the SHE 1310. For example, a section 1320b of the SHE 1310 includes a width that is similar, or substantially similar to the width 1312 in the section 1320a, but is offset or shifted with respect to the section 1320a. Further, a section 1320c of the SHE 1310 is in line, or substantially in line with the section 1320a, but includes a width that is greater than the width 1312. Although not shown, other sections may include a width that is less than the width 1312.

Due to the process variations, the NSI will vary. For example, the SHE 1310, which provides electrical isolation, may provide relatively less isolation at a location corresponding to the section 1320a as compared the section 1320c. Referring to Eq. (1), the coupling factor α can be inversely proportional to the width of the SHE. Also, the coupling factor α may be greater at the section 1320a as compared to the section 1320c, due to the width 1312 being less than the width of the section 1320c. Accordingly, the $V_{OD}$ may be greater at the section 1320a as compared to the section 1320c. Further, the offset relationship between the section 1320a and the section 1320b may different degrees of cutting of the respective SC-SGD memory holes in locations corresponding to the sections 1320a and 1320b. In this regard, the amount of material removed from certain features of the memory holes (e.g., channel, charge trap layer, and dielectric layer) can vary, and accordingly, the NSI can vary.

Figure 14:
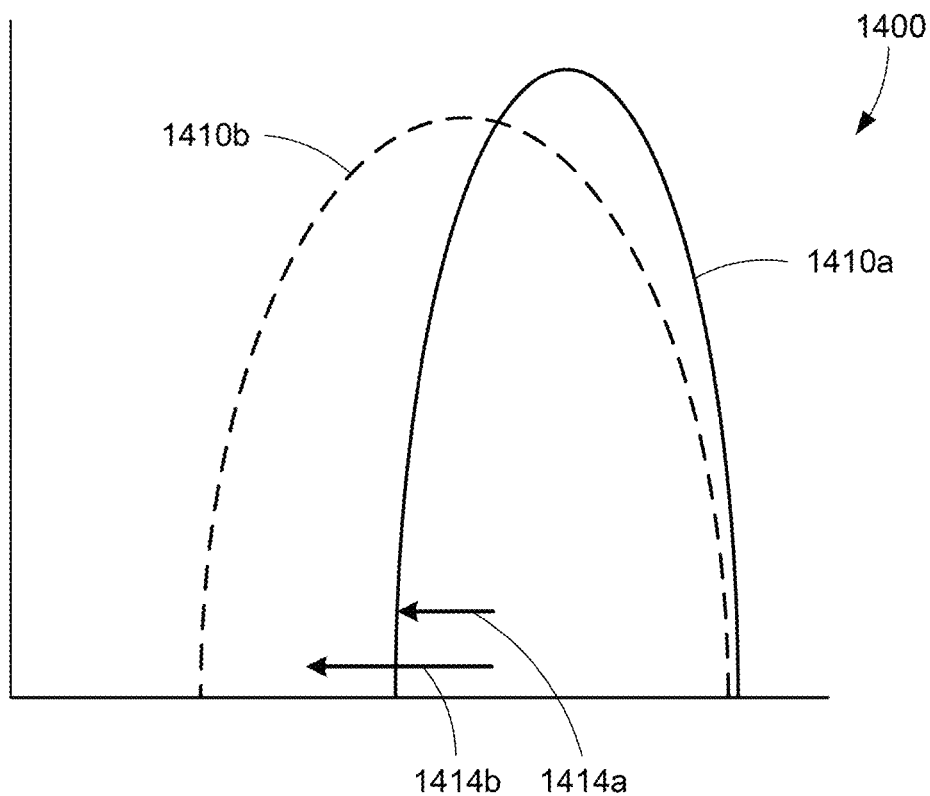
FIG. 14 illustrate a graph showing the differences in Vt of memory holes based upon the magnitude of NSI, in accordance with some described embodiments.

FIG. 14 illustrate a graph 1400 showing the differences in Vt of memory holes based upon the magnitude of NSI, in accordance with some described embodiments. As shown, a curve 1410a represents the Vt distribution for all FC-SGD memory holes, and a curve 1410b represents the Vt distribution for all SC-SGD memory holes. Additionally, several arrows are shown, and represent the relative degree to which Vt of a memory hole will shift down based upon NSI. For example, an arrow 1414a represents the downshift of Vt for SC-SGD of memory holes exposed to a relatively lower degree of NSI, while an arrow 1414b represents the downshift of Vt for SC-SGD of memory holes exposed to a relatively higher degree of NSI. However, by providing a negative bias on the unselected gate of a memory structure (described above), the downshifting can be managed and the curve 1410b can better resemble (i.e., overlap) the curve 1410a. While, the negative bias provides some improvement, other techniques can be combined and will be discussed below.

Figure 15A:
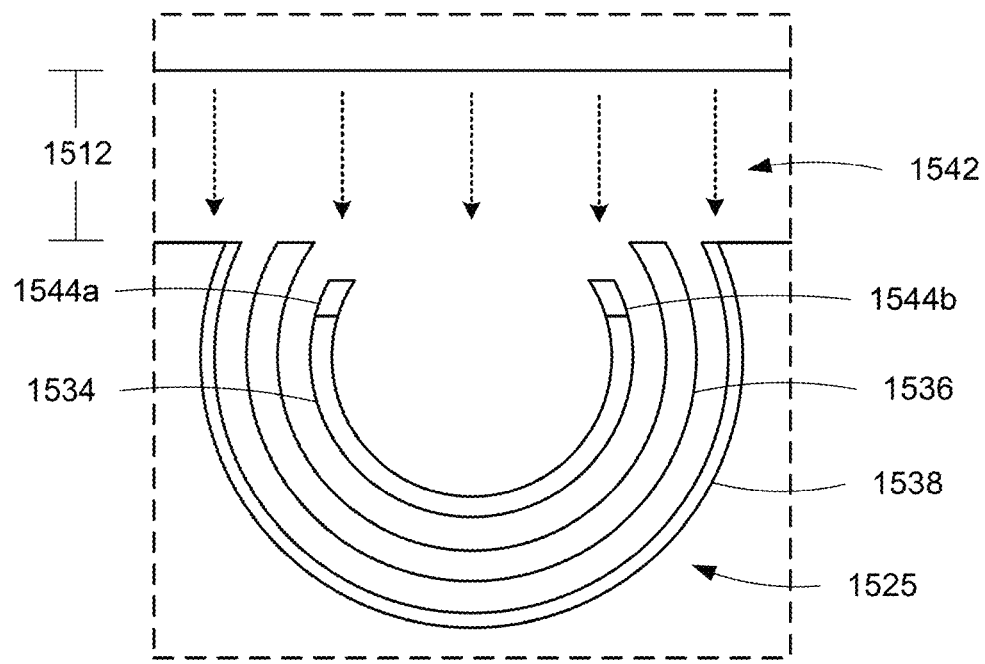
FIG. 15A illustrates an SC-SGD memory hole exposed to NSI during a verify operation.
Figure 15B:
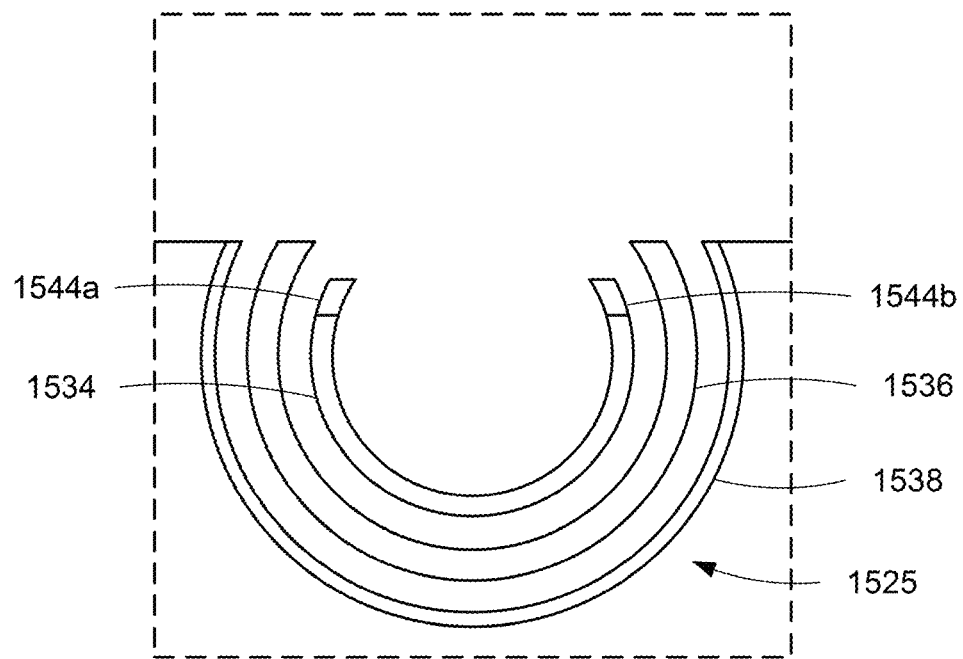
FIG. 15B illustrates the SC-SGD memory hole exposed to NSI during a programming operation.
Figure 15C:
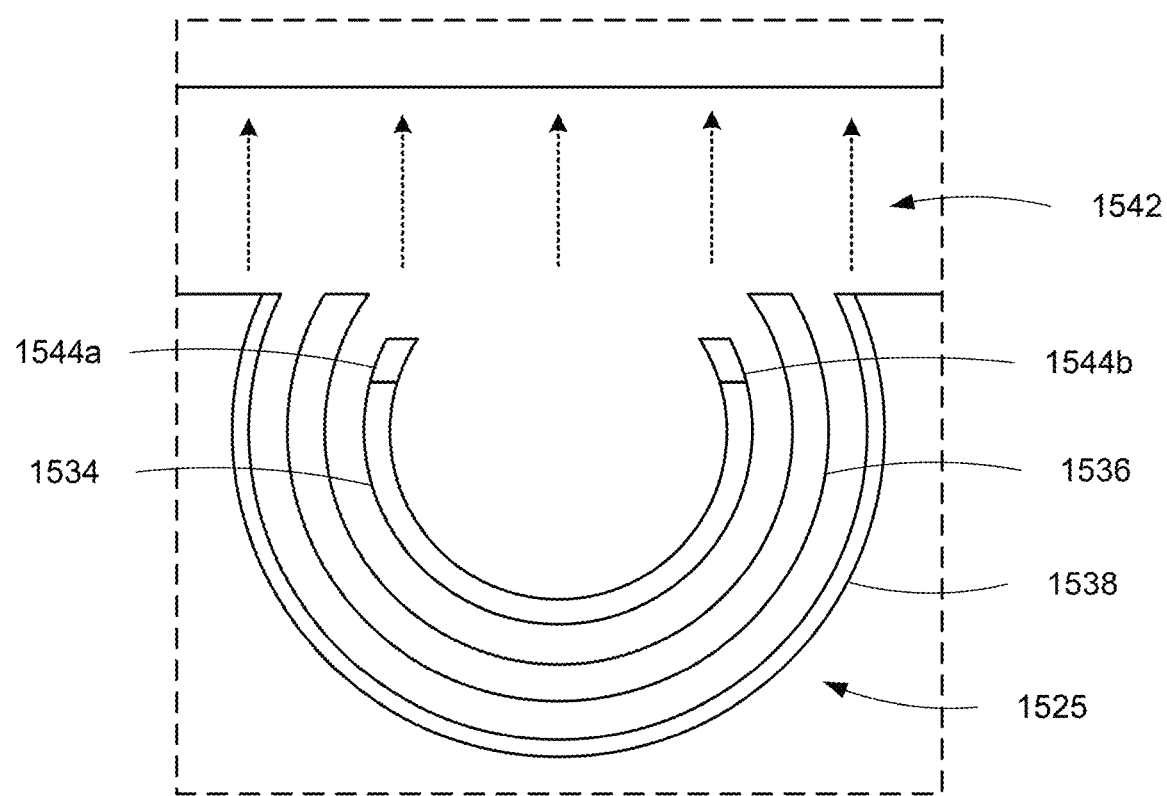
FIG. 15C illustrates the SC-SGD memory hole during a read operation.

FIGS. 15A-15C show and describe SC-SGD memory holes exposed to NSI, as well as additional modifications to mitigate the associated effects of NSI. Further, FIGS. 15A-15C show and describe a memory hole accessed for various purposes (e.g., verify, program, and read). Also, the techniques shown and described in FIGS. 15A-15C can exploit the NSI for various purposes. An SC-SGD memory hole 1525 may include several features shown and described for an SC-SGD memory hole (see FIG. 10, for example), such as a channel 1534 (including the end regions 1544a and 1544b, or tips), a charge trap layer 1536, and a dielectric layer 1538.

FIG. 15A illustrates an SC-SGD memory hole 1525 exposed to NSI during a verify operation. As shown, the SC-SGD memory hole 1525 is exposed to an electric field 1542 (represented by arrows), resulting in NSI. During a verify operation, a verification pulse (periodic) is sent to the SC-SGD memory hole 1525 to determine whether the SC-SGD memory hole 1525 is programmed to the desired Vt. By modifying (i.e., increasing) the electric field 1542, which can be due in part to the SHE width 1512 or other characteristics, can control degree to which the end regions 1544a and 1544b can be turned on during the verify operation. Conversely, when the electric field 1542 is relatively weaker (i.e., lower), the verify operation may determine the SC-SGD memory hole 1525 is programmed to a desired Vt, as the electric field 1542 (when weaker) does not downshift Vt. As a result, the SC-SGD memory hole 1525 can "self-compensate" and react in a desired manner based upon the NSI.

FIG. 15B illustrates the SC-SGD memory hole 1525 exposed to NSI during a programming operation. Due to the Vt downshift of the SC-SGD memory hole 1525 (described above generally for memory holes), the verify operation may initially fail, causing a controller of the memory structure (not shown in FIG. 15B) to provide one or more additional program pulses, thereby providing more electrons to the charge trap layer 1536 and causing the SC-SGD memory hole 1525 to be programmed to a higher Vt. This higher programmed Vt for the SC-SGD memory hole 1525 may more closely resemble the Vt distribution for FC-SGD (e.g., curve 1410a in FIG. 14). As a result, the SC-SGD memory hole 1525 can "self-compensate" and be programmed to the desired Vt, such as a Vt for FC-SGD.

FIG. 15C illustrates the SC-SGD memory hole 1525 during a read operation. Subsequent to the programming operation, the charge trap layer 1536 carries a sufficient number of electrons for self-compensation. For example, during sensing, the electric field 1542, when relatively weak or even negative, the SC-SGD memory hole 1525 will remain off (i.e., no current leakage due to parasitic transistors) based on the additional electrons.

Figure 16:
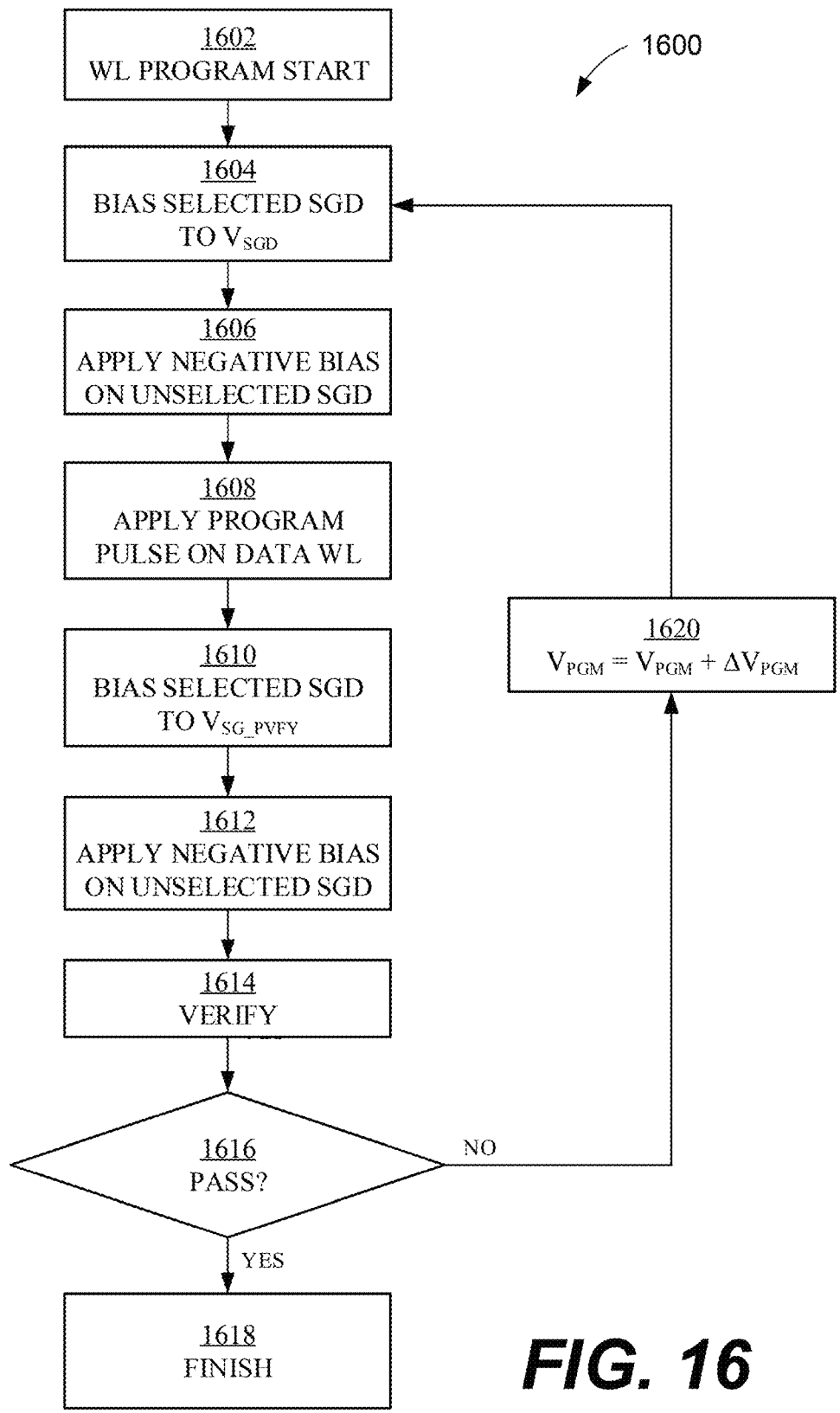
FIG. 16 illustrates a flowchart showing a method for programming a memory structure, in accordance with some described embodiments.

FIG. 16 illustrates a flowchart 1600 showing a method for programming a memory structure, in accordance with some described embodiments. At step 1602, a data word line ("WL") program begins. At step 1604, a bias voltage ($V_{SGD}$) is applied selected SGD. In some embodiments, $V_{SGD}$ is approximately 3 V. At step 1606, a negative bias voltage ($V_{NEG\_PGM}$) is applied to the unselected SGD. At step 1608, a program pulse is applied to the data WL. The data WL may be accessed using the selected SGD. At step 1610, a bias voltage ($V_{SG\_PVFY}$) is applied selected SGD. At step 1612, a negative bias voltage ($V_{NEG\_PGM}$) is applied to the unselected SGD. At step 1614, a verify operation occurs. At step 1616, a decision is made whether the threshold voltage Vt is verified. If the threshold voltage Vt is verified to be at the desired Vt, the verify operation is complete and the flowchart proceeds to step 1618. If the threshold voltage Vt is not verified to be at the desired Vt, the flowchart proceeds to step 1620. At step 1620, an additional, or stepped up, programming voltage is ($\Delta V_{PGM}$) is added to the previous programming voltage ($V_{PGM}$) and the flowchart proceeds to step 1604 where an increased bias voltage ($V_{SGD}$) can be applied selected SGD.

Figure 17:
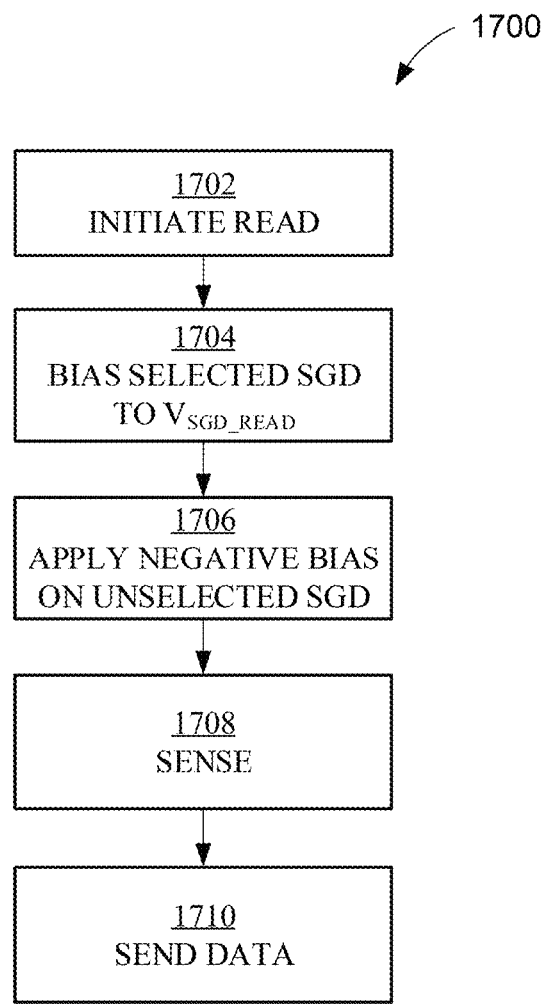
FIG. 17 illustrates a flowchart showing a method for reading from memory structure, in accordance with some described embodiments.

FIG. 17 illustrates a flowchart 1700 showing a method for reading from memory structure, in accordance with some described embodiments. At step 1702, a read command is initiated. At step 1704, a bias voltage ($V_{SGD\_READ}$) is applied to the selected SGD. At step 1706, a negative bias voltage ($V_{NEG\_READ}$) is applied to the unselected SGD. At step 1708, the memory structure is sensed. This may include, for example, reading data from a string of memory controlled by selected SGD.

Figure 18:
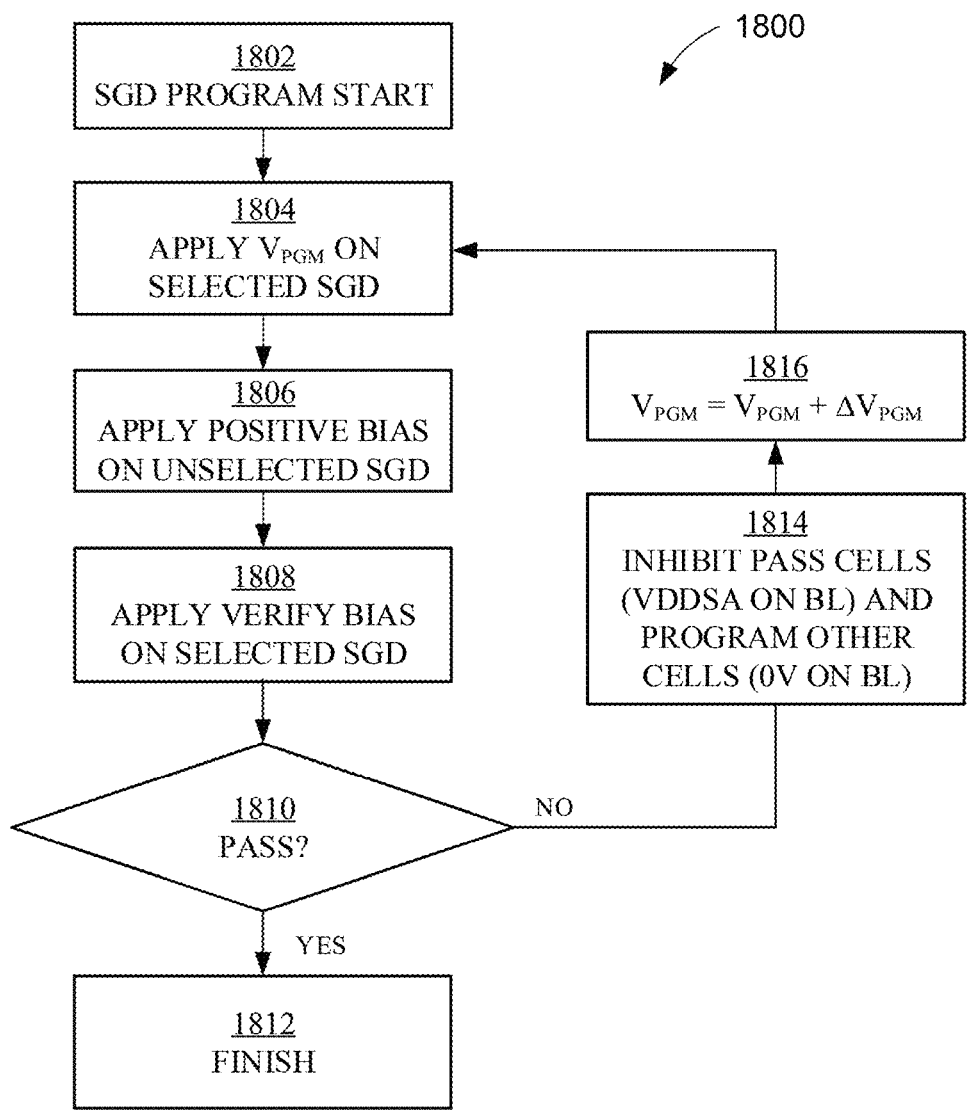
FIG. 18 illustrates a flowchart showing an alternate method for programming a memory structure, in accordance with some described embodiments.

FIG. 18 illustrates a flowchart 1800 showing an alternate method for programming a memory structure, in accordance with some described embodiments. At step 1802, the SGD program begins. At step 1804, a programming voltage ($V_{PGM}$) is applied selected SGD. At step 1806, a positive bias voltage ($V_{NSI\_PVFY}$) is applied to the unselected SGD. The positive bias voltage ($V_{NSI\_PVFY}$) may form the $V_{ATTACKER}$ (discussed above) that is applied to the selected SGD. At step 1808, a verify bias is applied to the selected SGD. At step 1810, a decision is made whether the threshold voltage Vt is verified. If the threshold voltage Vt is verified to be at the desired Vt, the verify operation is complete and the flowchart proceeds to step 1812. If the threshold voltage Vt is not verified to be at the desired Vt, the flowchart proceeds to step 1814. At step 1814, the passed (verified) cells (SC-SGD) are inhibited on the bit line ("BL") and the remaining cells (SC-SGD) are programmed at 0V on the BL. At step 1816, an additional, or stepped up, programming voltage is ($\Delta V_{PGM}$) is added to the previous programming voltage ($V_{PGM}$) and the flowchart proceeds to step 1804 where the programming voltage ($V_{PGM}$) is increased and applied selected SGD.

Figure 19:
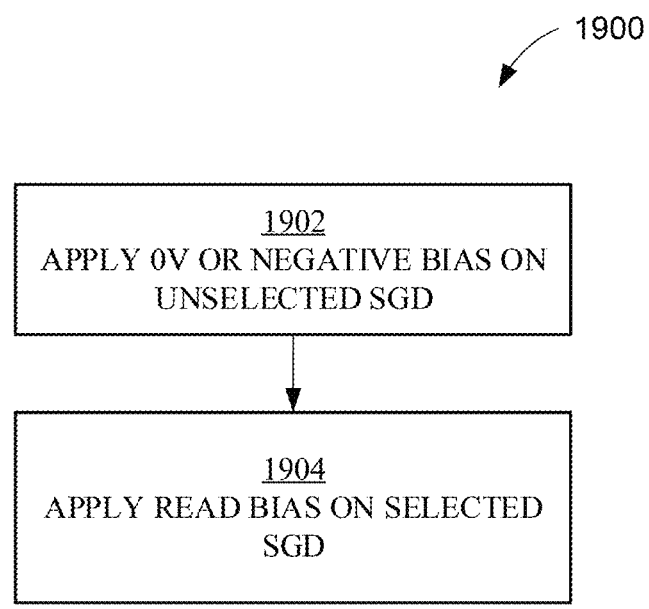
FIG. 19 illustrates a flowchart showing an alternate method for reading from memory structure, in accordance with some described embodiments.

FIG. 19 illustrates a flowchart 1900 showing an alternate method for reading from memory structure, in accordance with some described embodiments. At step 1902, a voltage ($V_{NSI\_READ}$) is applied to the unselected SGD. The applied voltage during the read operation ($V_{NSI\_READ}$), or other operation, can be either 0V or a negative voltage (e.g., −2V). As a result, the applied voltage during the read operation ($V_{NSI\_READ}$) or other operation, is less than the positive bias voltage ($V_{NSI\_PVFY}$) in step 1806 (in FIG. 18). At step 1904, a verify bias voltage ($V_{CG}$) is applied to the selected SGD.

The above discussion is meant to be illustrative of the principles and various embodiments of the present invention. Numerous variations and modifications will become apparent to those skilled in the art once the above disclosure is fully appreciated, and may be employed without departing from the scope of the disclosure, limited only by any practical limitations related to the materials and physical principles of the devices that are described. It is intended that the following claims be interpreted to embrace all such variations and modifications.

What is claimed is:

1. A method for accessing a memory device, the method comprising:
    during a sensing operation, biasing, using a first voltage, a first semi-circular drain side select gate (SC-SGD), wherein the first SC-SGD is located on a first edge of an etched region; and
    during the sensing operation, biasing, using a second voltage that is less than the first voltage, a second SC-SGD, wherein second SC-SGD is located on a second edge of the etched region opposite the first edge.

2. The method according to claim 1, wherein the second voltage comprises a negative voltage.

3. The method according to claim 2, wherein the etched region comprises a shallow hole etch (SHE) cut.

4. The method according to claim 1, wherein, during a programming operation to program the first SC-SGD, the method further comprises:
    providing a program pulse to the first SC-SGD; and
    applying a positive bias voltage on the second SC-SGD.

5. A method for accessing a memory device, the method comprising:
    biasing, using a first voltage, a first semi-circular drain side select gate (SC-SGD), wherein the first SC-SGD is located on a first edge of an etched region; and
    biasing, using a second voltage that is less than the first voltage, a second SC-SGD, wherein second SC-SGD is located on a second edge of the etched region opposite the first edge, and
    wherein, during a read operation, the method further comprises:
    selecting, using the first SC-SGD, a string to read;
    biasing, using a read voltage, the first SC-SGD; and
    biasing, using a negative read voltage, the second SC-SGD.

6. The method according to claim 5, wherein the second voltage comprises a negative voltage.

7. The method according to claim 6, wherein the etched region comprises a shallow hole etch (SHE) cut.

8. A memory system, comprising:
    a memory device; and
    a controller operatively coupled to the memory device, the controller being configured to:
    bias, using a first voltage, a first semi-circular drain side select gate (SC-SGD), wherein the first SC-SGD is located on a first edge of an etched region; and
    bias, using a second voltage that is less than the first voltage, a second SC-SGD, wherein the second SC-SGD is located on a second edge of the etched region opposite the first edge.

9. The memory system according to claim 8, wherein the second voltage comprises a negative voltage.

10. The memory system according to claim 9, wherein the etched region comprises a shallow hole etch (SHE) cut.

11. The memory system according to claim 8, wherein, during a programming operation to program the first SC-SGD, the controller being configured to:
    provide a program pulse to the first SC-SGD; and
    apply a positive bias voltage on the second SC-SGD.

12. The memory system according to claim 8, wherein, during a read operation, the controller being configured to:

select, using the first SC-SGD, a string to read;
bias, using a read voltage, the first SC-SGD; and
bias, using a negative read voltage, the second SC-SGD.

* * * * *